(12) United States Patent
Nawata et al.

(10) Patent No.: US 12,246,482 B2
(45) Date of Patent: Mar. 11, 2025

(54) CONTROL APPARATUS, IMPRINT APPARATUS, AND METHOD OF MANUFACTURING ARTICLE

(71) Applicant: CANON KABUSHIKI KAISHA, Tokyo (JP)

(72) Inventors: Ryo Nawata, Tochigi (JP); Hiroyuki Sekiguchi, Tochigi (JP); Takashi Shibayama, Tochigi (JP); Yuma Onizawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 462 days.

(21) Appl. No.: 17/410,191

(22) Filed: Aug. 24, 2021

(65) Prior Publication Data

US 2022/0063176 A1    Mar. 3, 2022

(30) Foreign Application Priority Data

Aug. 28, 2020    (JP) ................................. 2020-144872

(51) Int. Cl.
*G05B 19/404*    (2006.01)
*B29C 59/00*    (2006.01)
*B29C 59/02*    (2006.01)
*G05D 19/00*    (2006.01)
*G05D 19/02*    (2006.01)
*G06N 20/00*    (2019.01)
*H01L 21/66*    (2006.01)

(52) U.S. Cl.
CPC ............ *B29C 59/002* (2013.01); *B29C 59/02* (2013.01); *G05B 19/404* (2013.01); *G05D 19/00* (2013.01); *G05D 19/02* (2013.01); *G06N 20/00* (2019.01); *H01L 22/20* (2013.01)

(58) Field of Classification Search
None
See application file for complete search history.

(56) References Cited

U.S. PATENT DOCUMENTS

| 9,186,765 | B2* | 11/2015 | Ando .................. B23Q 17/007 |
| 9,977,346 | B2* | 5/2018 | Okada ................ G03F 7/70725 |
| 10,274,932 | B2* | 4/2019 | Ono ..................... G05B 19/409 |
| 2006/0139613 | A1 | 6/2006 | Houkes et al. |

(Continued)

FOREIGN PATENT DOCUMENTS

| CN | 110244077 A | * | 9/2019 | ............ G01P 21/025 |
| JP | 2003108236 A | * | 4/2003 | |

(Continued)

*Primary Examiner* — Jason Lin
(74) *Attorney, Agent, or Firm* — ROSSI, KIMMS & McDOWELL LLP

(57) ABSTRACT

A control apparatus which controls a force applied to an object, includes a driver configured to apply the force to the object, an estimator configured to estimate, based on information related to a state of the object, an estimated value of a disturbance force to be applied to the object, a corrector configured to correct, based on the estimated value, a command value provided to the driver so as to reduce an influence of the disturbance force, and a determiner configured to execute processing for determining a plurality of parameter values to be used by the estimator to obtain the estimated value based on the information.

19 Claims, 17 Drawing Sheets

(56) References Cited

U.S. PATENT DOCUMENTS

| | | | |
|---|---|---|---|
| 2012/0010744 A1* | 1/2012 | Yamashita | B23Q 17/0976 700/173 |
| 2012/0095724 A1* | 4/2012 | Ando | B23Q 17/12 702/145 |
| 2012/0226374 A1* | 9/2012 | Yasuda | B23Q 17/0976 700/108 |
| 2012/0296471 A1* | 11/2012 | Inaba | B25J 9/1694 901/42 |
| 2013/0015598 A1* | 1/2013 | Kimura | B82Y 10/00 425/150 |
| 2014/0288525 A1* | 9/2014 | Fudaba | A61B 1/0016 604/95.01 |
| 2015/0254336 A1* | 9/2015 | Besuchet | G05B 15/02 707/737 |
| 2016/0116899 A1* | 4/2016 | Piner | B23Q 11/0039 700/173 |
| 2016/0346891 A1* | 12/2016 | Ando | G05B 19/404 |
| 2017/0060104 A1* | 3/2017 | Genma | G05B 13/0265 |
| 2017/0090430 A1* | 3/2017 | Nakazawa | G05B 13/028 |
| 2017/0106542 A1* | 4/2017 | Wolf | B25J 9/0081 |
| 2018/0164757 A1* | 6/2018 | Matsushima | G06N 3/088 |
| 2019/0001490 A1* | 1/2019 | Washizu | B25J 9/1651 |
| 2019/0005413 A1* | 1/2019 | Sato | G05B 19/402 |
| 2020/0272122 A1* | 8/2020 | Oikawa | G05B 19/4065 |
| 2021/0191359 A1* | 6/2021 | Iseli | G01B 21/045 |

FOREIGN PATENT DOCUMENTS

| | | | |
|---|---|---|---|
| JP | 2013007460 A | * | 1/2013 |
| KR | 1020060076749 A | | 7/2006 |

* cited by examiner

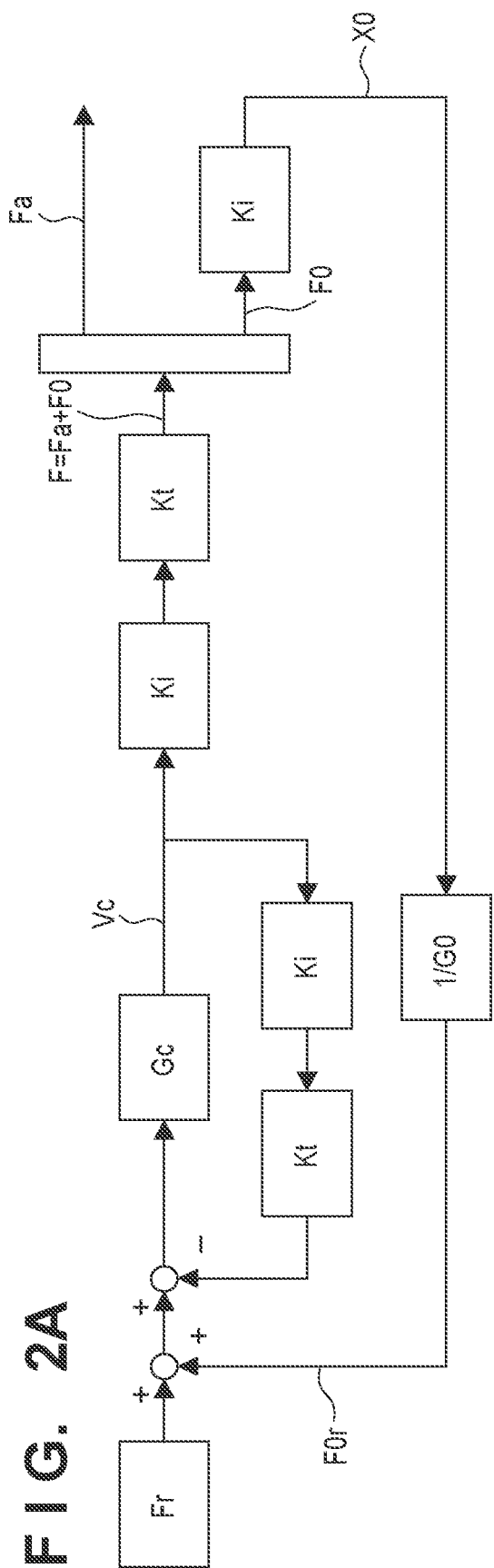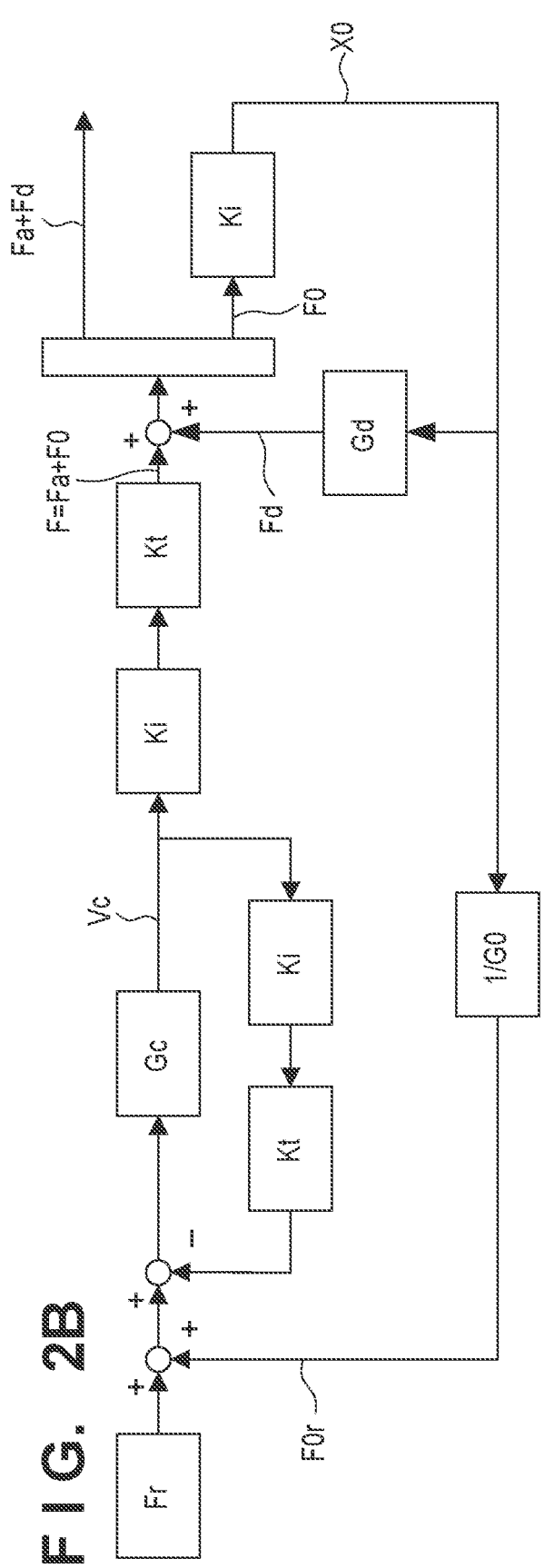

CONTROL APPARATUS, IMPRINT APPARATUS, AND METHOD OF MANUFACTURING ARTICLE

BACKGROUND OF THE INVENTION

Field of the Invention

The present invention relates to a control apparatus, an imprint apparatus, and a method of manufacturing an article.

Description of the Related Art

A manufacturing apparatus that manufactures an article such as a semiconductor device, a MEMS, or the like requires accurate control to increase the performance of the article and/or the yield. Hence, a control object of the manufacturing apparatus needs to be controlled accurately, and a desired control force needs to be applied to the control object. However, in many cases, a disturbance force may be applied to a control object due to the fact that the control object is accompanied by a feeder and/or a guide for supplying electric power and/or a fluid, and a desired force may not be applied to the control object problematically. To solve this problem, Japanese Patent Laid-Open No. 2003-108236 discloses an active vibration isolator that includes a feedback corrector (disturbance observer) which estimates an input of a disturbance into a system based on an output from the system. The feedback corrector includes a nominal model that estimates an input based on an output from the system.

However, the vibration isolator disclosed in Japanese Patent Laid-Open No. 2003-108236 does not have a means for determining a nominal model. Hence, if the state of the vibration isolator changes or if the environment in which the vibration isolator is installed changes, it will be impossible to make the nominal model follow this change.

SUMMARY OF THE INVENTION

The present invention provides a technique advantageous in improving or maintaining control accuracy.

One of aspects of the present invention provides a control apparatus that controls a force applied to an object, comprising: a driver configured to apply the force to the object; an estimator configured to estimate, based on information related to a state of the object, an estimated value of a disturbance force to be applied to the object; a corrector configured to correct, based on the estimated value, a command value provided to the driver so as to reduce an influence of the disturbance force; and a determiner configured to execute processing for determining a plurality of parameter values to be used by the estimator to obtain the estimated value based on the information.

Further features of the present invention will become apparent from the following description of exemplary embodiments with reference to the attached drawings.

BRIEF DESCRIPTION OF THE DRAWINGS

FIGS. 2A and 2B are block diagrams each showing the arrangement of a force feedback control system according to the first embodiment;

DESCRIPTION OF THE EMBODIMENTS

Figure 1A:
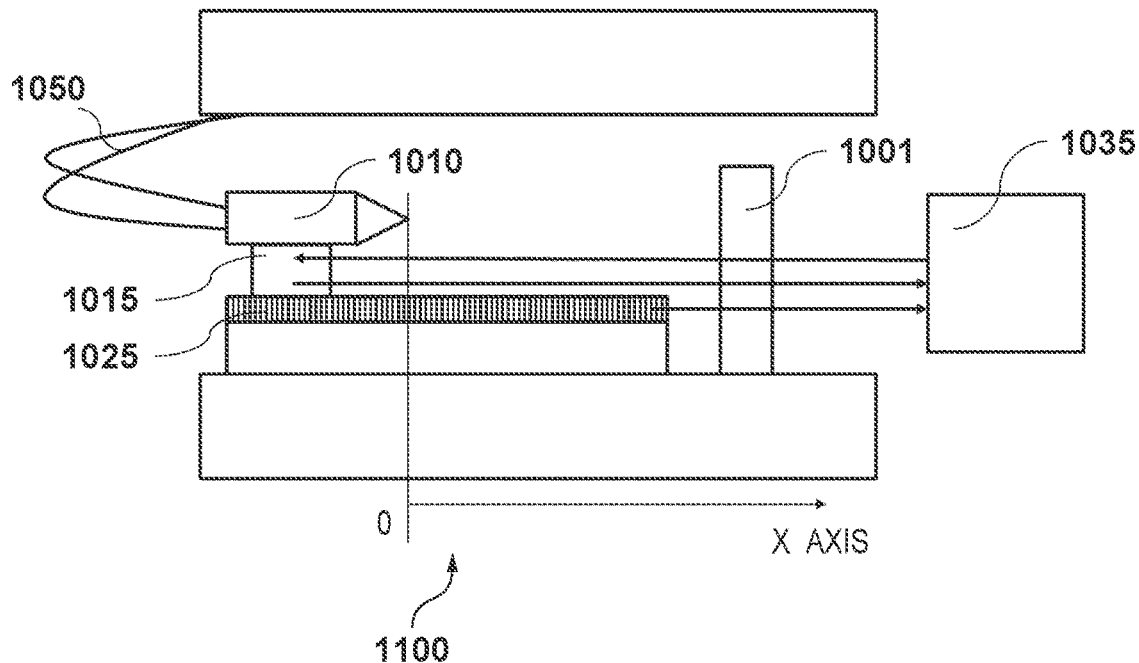
FIGS. 1A and 1B are schematic views each showing the arrangement of a control apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1B:
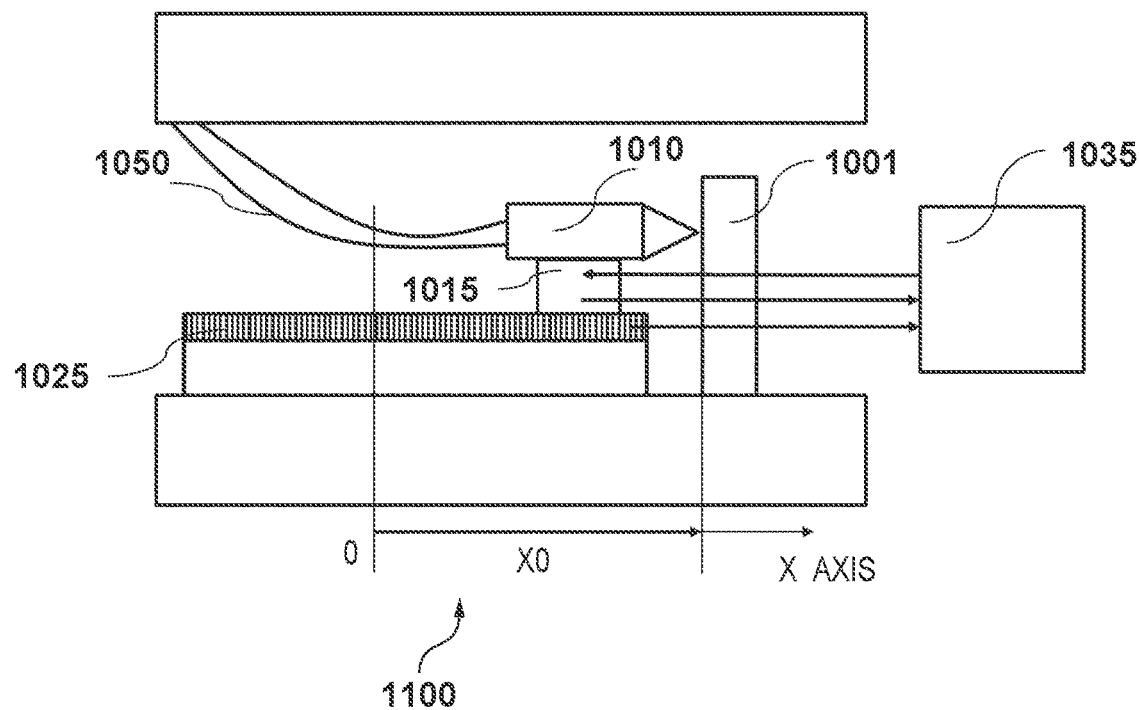

FIGS. 1A and 1B each show the arrangement of a control apparatus 1100 according to the first embodiment. FIG. 1A shows a state before a processor 1010 comes into contact with a workpiece 1001, and FIG. 1B shows a state in which the processor 1010 has come into contact with the workpiece 1001. The control apparatus 1100 can be formed to process the workpiece 1001 by, for example, pressing the processor (object) 1010 against the workpiece (processing object) 1001 at a desired force. The control apparatus 1100 controls the force applied to the processor (object) 1010. A driving direction of the processor 1010 will be described as the X-axis hereinafter.

The control apparatus 1100 can include, for example, the processor 1010, a driver 1015 for driving the processor 1010 in a predetermined direction (X-axis direction), a measurement unit 1025 for measuring the displacement of the processor 1010, and a controller 1035 for outputting a manipulation amount (command value) to the driver 1015. In addition, the control apparatus 1100 can include a feeder (member) 1050 for supplying energy (for example, electric power) and a fluid (a gas and/or a liquid) necessary for the processing to the processor 1010. The feeder 1050 is directly or indirectly connected to the processor 1010, and a disturbance force can be applied to the processor 1010 via the feeder 1050. The driver 1015 can be formed to apply a force to the processor 1010 in the X-axis direction. The driver 1015 can include, for example, an actuator such as a linear actuator or the like. For example, a linear encoder or the like can be used as the measurement unit 1025. The controller 1035 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer embedded with a program, a dedicated computer, or a combination of all or some of these components.

The controller 1035 can have a mode for performing position feedback control on the processor 1010 set as a control object, and a mode for performing force feedback control on the processor 1010 set as the control object. The controller 1035 can perform position feedback control on the processor 1010 when the processor 1010 is to be moved near the workpiece 1001, and perform force feedback control on the processor 1010 when the workpiece 1001 is to be processed by the processor 1010.

FIGS. 2A and 2B are block diagrams each showing the arrangement and the operation of the control apparatus 1100 when force feedback control is performed. Here, FIG. 2A shows a case in which a disturbance force Fd from the feeder 1050 is not applied to the processor 1010, and FIG. 2B shows a case in which the disturbance force Fd from the feeder 1050 is applied to the processor 1010. FIG. 2A will be described first. Reference symbol Fr indicates a target value (to be referred to as a force target value hereinafter) of a force applied to the processor 1010, reference symbol Gc indicates a control compensator, reference symbol Ki indicates a current gain, and reference symbol Kt indicates a thrust constant of the driver 1015. Reference symbol G0 indicates a transfer function of the force of the processor 1010 to a displacement, and reference symbol X0 indicates a displacement (a position measurement value obtained by the measurement unit 1025) of the processor 1010. An output F output by the driver 1015 is a sum of a driving force F0 necessary for driving the processor 1010 and a processing force Fa necessary for processing the workpiece 1001.

To control the processing force Fa in accordance with the force target value Fr, the processing force Fa needs feedback. However, due to the terms of processing, the control apparatus 1100 according to the first embodiment cannot directly measure the processing force Fa. Hence, in FIG. 2A, the output F obtained by multiplying a manipulation voltage Vc with the thrust constant Kt and the current gain Ki is supplied as feedback. The manipulation voltage Vc can be understood to be a manipulation amount or a command value. Since the output F is obtained by adding the processing force Fa and the driving force F0, the target value of the driving force F0 needs to be added to the force target value Fr. Hence, in FIG. 2A, a target driving force F0$r$ is added to the force target value Fr. The target driving force F0$r$ may be obtained by multiplying the displacement X0 of the processor 1010 by 1/G0 as shown in FIG. 2A or may be prepared in advance as a table corresponding to the displacement X0. This will allow the processing force Fa to be controlled according to the force target value Fr.

In reality, however, disturbance force Fd will be applied to the processor 1010 as shown in FIG. 2B due to the influence of the feeder 1050 shown in FIGS. 1A and 1B, the processing force Fa will be Fa'=Fa+Fd, and the workpiece 1001 cannot be processed by the processing force Fa according to the force target value Fr. The disturbance force Fd depends on the displacement and the speed of the processor 1010 in the first embodiment. Hence, as shown in FIG. 2B, letting Gd be a transfer function from the displacement of the processor 1010 to the disturbance force Fd and X0 be the displacement of the processor 1010, the disturbance force Fd will be expressed as Fd=Gd×X0.

Figure 3:
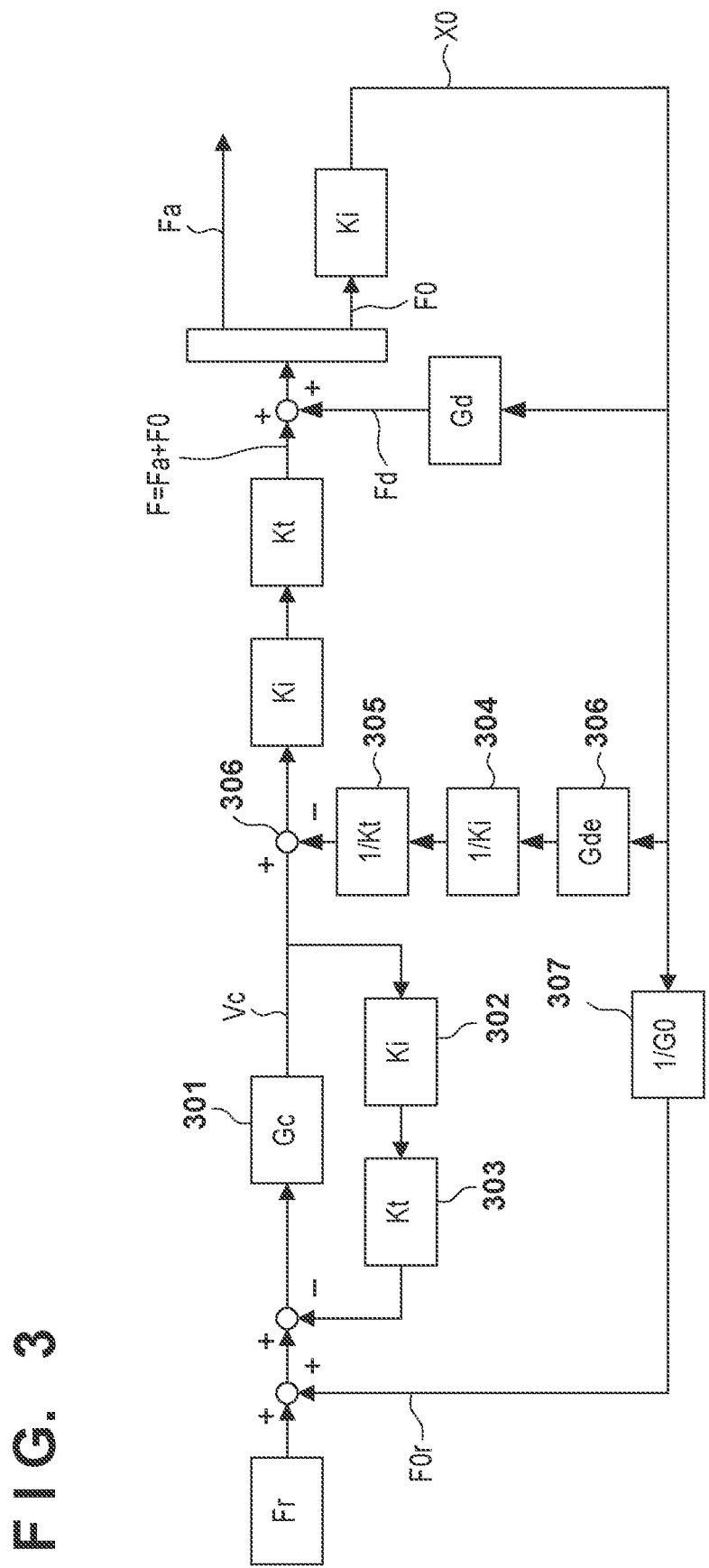
FIG. 3 is a block diagram showing the arrangement of the force feedback control system that has performed disturbance force correction according to the first embodiment.

Therefore, in the first embodiment, a disturbance estimator (estimator) Gde will be used as a disturbance observer as shown in FIG. 3. The disturbance estimator Gde estimates an estimated disturbance force Fde, as an estimation value of the disturbance force Fd applied to the processor 1010, based on information related to the state of the processor 1010. The disturbance estimator Gde can estimate the estimated disturbance force Fde applied to the processor 1010 based on, for example, the displacement X0 of the processor 1010 measured by the measurement unit 1025. The processor 1010 will be able to output the processing force Fa according to the force target value Fr by subtracting a voltage corresponding to the estimated disturbance force Fde from the manipulation voltage Vc. A disturbance estimator 1305 uses a plurality of parameter values determined in advance to obtain the estimated disturbance force Fde based on the information related to the state of the processor 1010. The plurality of parameter values are determined by the determiner 1350. Note that reference numerals 301 to 307 denoted in FIG. 3 indicate a correspondence relationship with the components shown in FIG. 13 to be described below.

Figure 13:
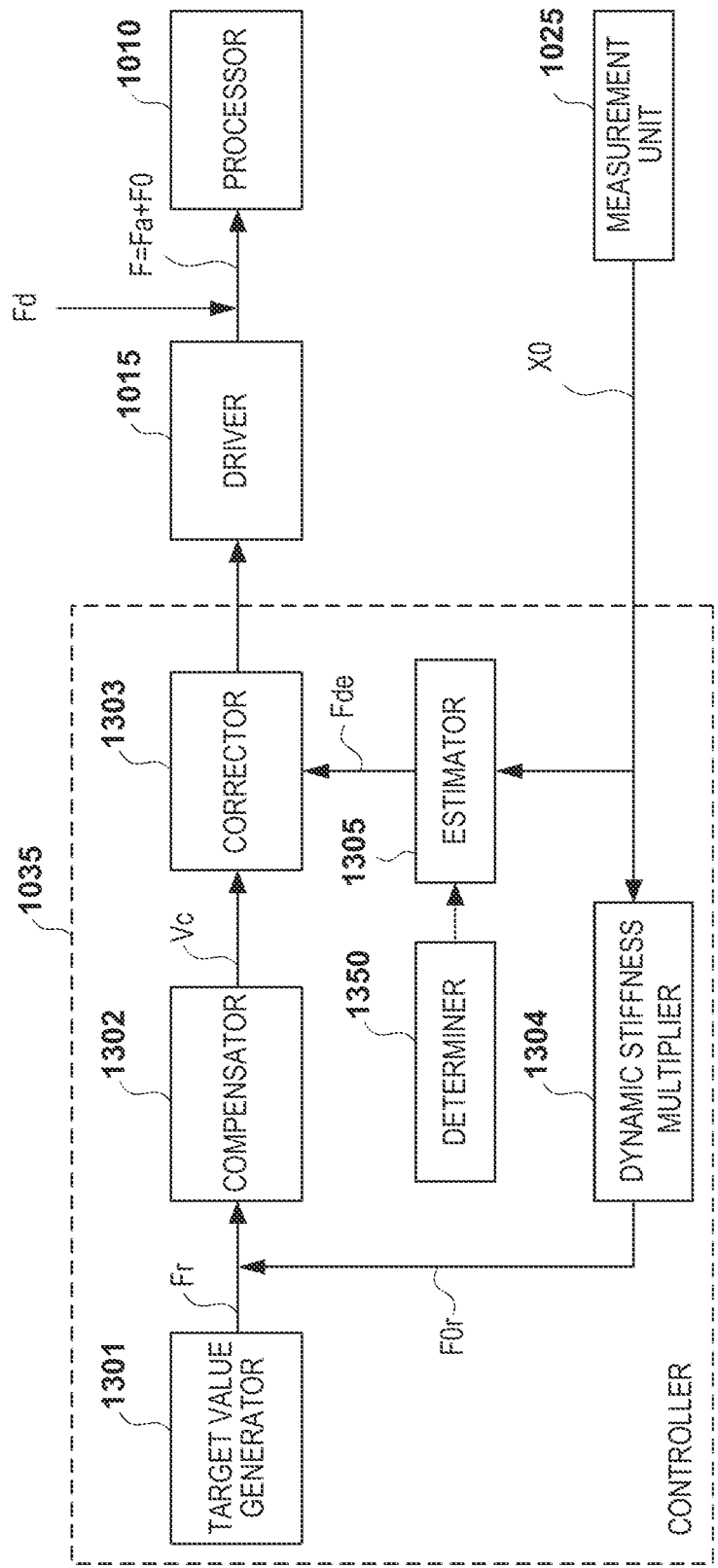
FIG. 13 is a block diagram for explaining FIG. 3 by using specific devices.

FIG. 13 shows an example of the physical arrangement of the control apparatus 1100 corresponding to FIG. 3. The controller 1035 can include a target value generator 1301, a compensator 1302, a corrector 1303, a dynamic stiffness multiplier 1304, and the disturbance estimator 1305. The target value generator 1301 generates the force target value Fr. The compensator 1302 obtains the manipulation voltage Vc from the sum of the force target value Fr and the target driving force F0$r$. The compensator 1302 corresponds to a block formed by the control compensator Gc (301), the current gain Ki (302), and the thrust constant Kt (303) of FIG. 3, and its gain is Gc/(1+GcKtKi). The corrector 1303 corresponds to a block formed by 1/Ki (304), 1/kt (305), and the operator (subtractor) 306 of FIG. 3. The dynamic stiffness multiplier 1304 corresponds to 1/G0 (307) of FIG. 3. The corrector 1303 corrects, based on the estimated disturbance force Fde, the manipulation amount (command value) provided to the driver 1015 to reduce the influence of the disturbance force Fd. The disturbance estimator 1305 corresponds to the disturbance estimator Gde (306) of FIG. 3.

Figure 4:
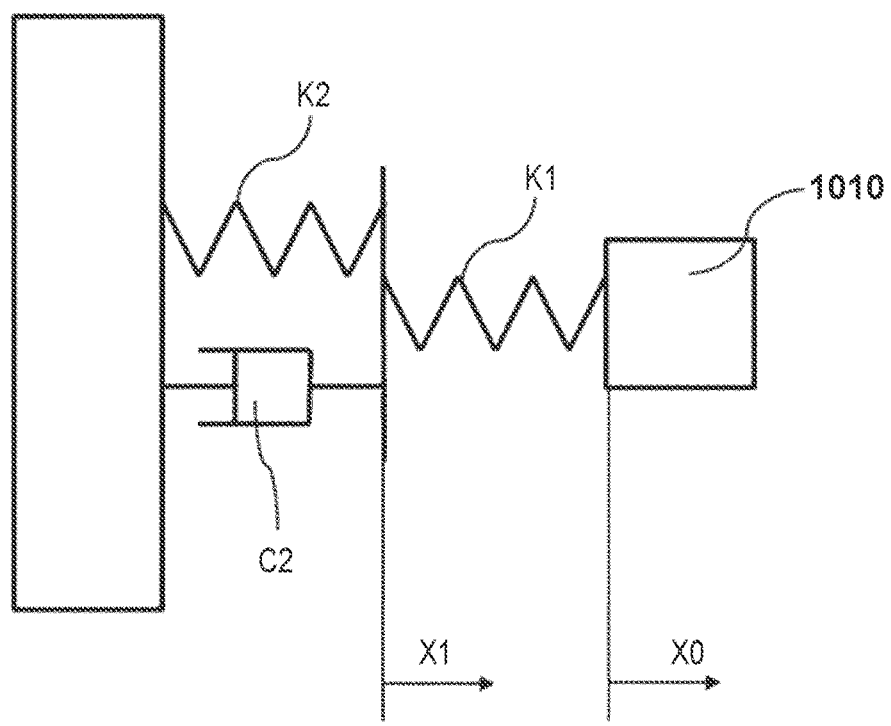
FIG. 4 is a schematic view showing a disturbance estimation model using a three element model.

The disturbance estimator Gde (306) will be described next. The disturbance estimator Gde has been obtained by modeling the transfer function Gd of a disturbance shown in FIGS. 2B and 3. The transfer function Gd of a disturbance represents a disturbance generated by the feeder 1050 shown in FIGS. 1A and 1B. Since the disturbance generated by the feeder 1050 is generated based on the displacement and the speed of the processor 1010, it can be modeled as a three element model using a spring (stiffness) and a damper (attenuation). Hence, the disturbance estimator Gde can also be modeled as a three element model. FIG. 4 shows a disturbance estimation model using one three element model. Letting X0 be the displacement of the processor 1010 and X1 be a displacement of a spring K2, the estimated disturbance force Fde can be expressed as $$Fde = -K1 \cdot (X0 - X1) \qquad (1)$$

$$Fde = -K2 \cdot X1 - C2 \cdot \dot{X}1 \quad (2)$$

Equation (1) and equation (2) can be deformed as $$\dot{X}1 = \frac{-(K1+K2)}{C2} \cdot X1 + \frac{K1}{C2} \cdot X0 \quad (3)$$

$$Fde = K1 \cdot X1 - K1 \cdot X0 \quad (4)$$

respectively.

Figure 5:
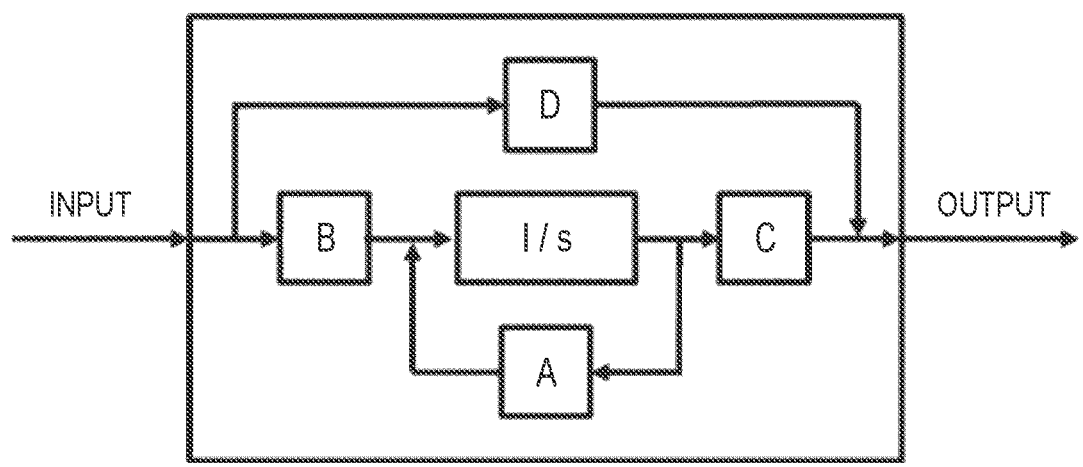
FIG. 5 is a schematic view showing a state space.

Since equation (3) represents a state equation and equation (4) represents an output equation, the disturbance estimation model shown in FIG. 4 can be expressed as a state space shown in FIG. 5. A state matrix A, an input matrix B, an output matrix C, and a direct matrix D of FIG. 5 can be expressed as $$A = \left[ \frac{-(K1+K2)}{C2} \right] \quad (5)$$

$$B = \left[ \frac{K1}{C2} \right] \quad (6)$$

$$C = [K1] \quad (7)$$

$$D = [-K1] \quad (8)$$

respectively.

Hence, the disturbance estimator Gde can be expressed by the state space shown in FIG. 5, and the estimated disturbance force Fde can be obtained when the displacement X0 of the processor 1010 is input to the disturbance estimator Gde.

In addition, solving a differential equation expressed by equations (1) and (2), the estimated disturbance force Fde can be expressed as a function of a time t by $$Fde = -\frac{K1 \cdot K2}{K1 + K2} \cdot X0 \cdot \left(1 - e^{-\frac{t}{T}}\right) \quad (9)$$

where T is a time constant of the disturbance estimation model and the disturbance estimator Gde shown in FIG. 4 and is expressed by $$T = \frac{C2}{K1 + K2} \quad (10)$$

Figure 6:
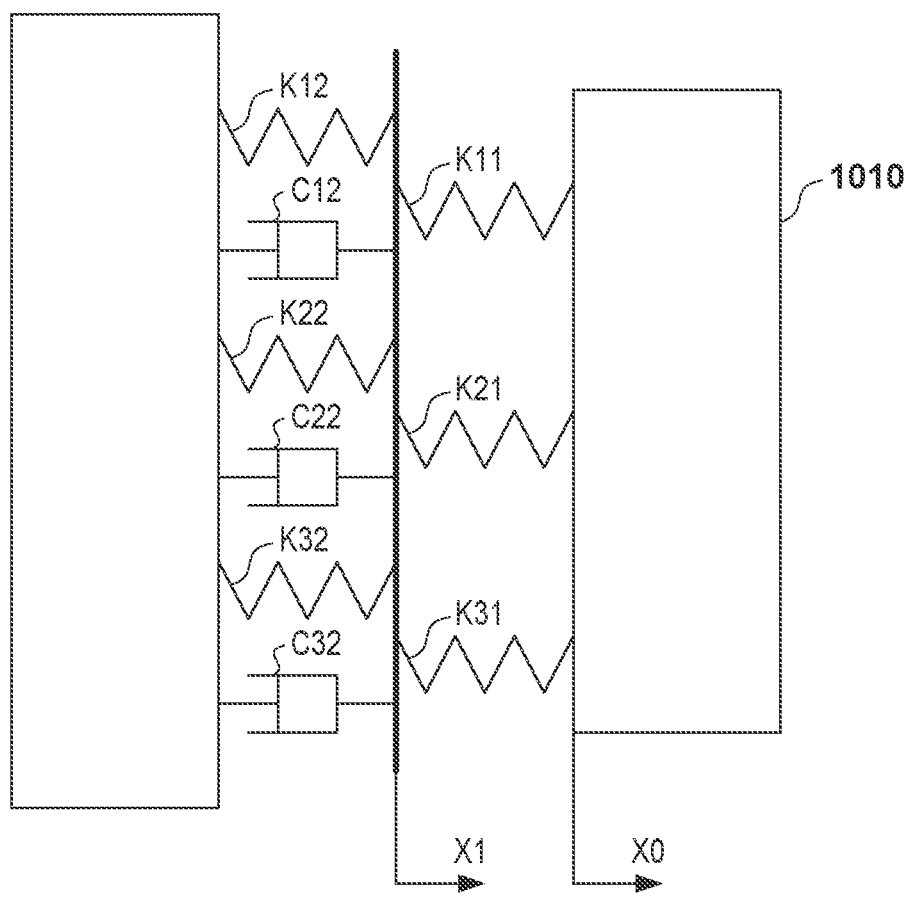
FIG. 6 is a schematic view showing a disturbance estimation model using three three-element models.

In a case in which the feeder 1050 is formed by a plurality of elements with different time constants from each other, a plurality of three element models will need to be combined. In the first embodiment, a disturbance estimation model obtained by combining three three-element models will be used as shown in FIG. 6. In the disturbance estimation model shown in FIG. 6, the state matrix A, the input matrix B, the output matrix C, and the direct matrix D of the disturbance estimator Gde are expressed as $$A = \begin{bmatrix} \frac{-(K11+K12)}{C12} & 0 & 0 \\ 0 & \frac{-(K21+K22)}{C22} & 0 \\ 0 & 0 & \frac{-(K31+K32)}{C32} \end{bmatrix} \quad (11)$$

$$B = \begin{bmatrix} \frac{K11}{C12} \\ \frac{K21}{C22} \\ \frac{K31}{C32} \end{bmatrix} \quad (12)$$

$$C = [K11 \; K21 \; K31] \quad (13)$$

$$D = [-K11 + K21 + K31] \quad (14)$$

respectively.

Figure 7:
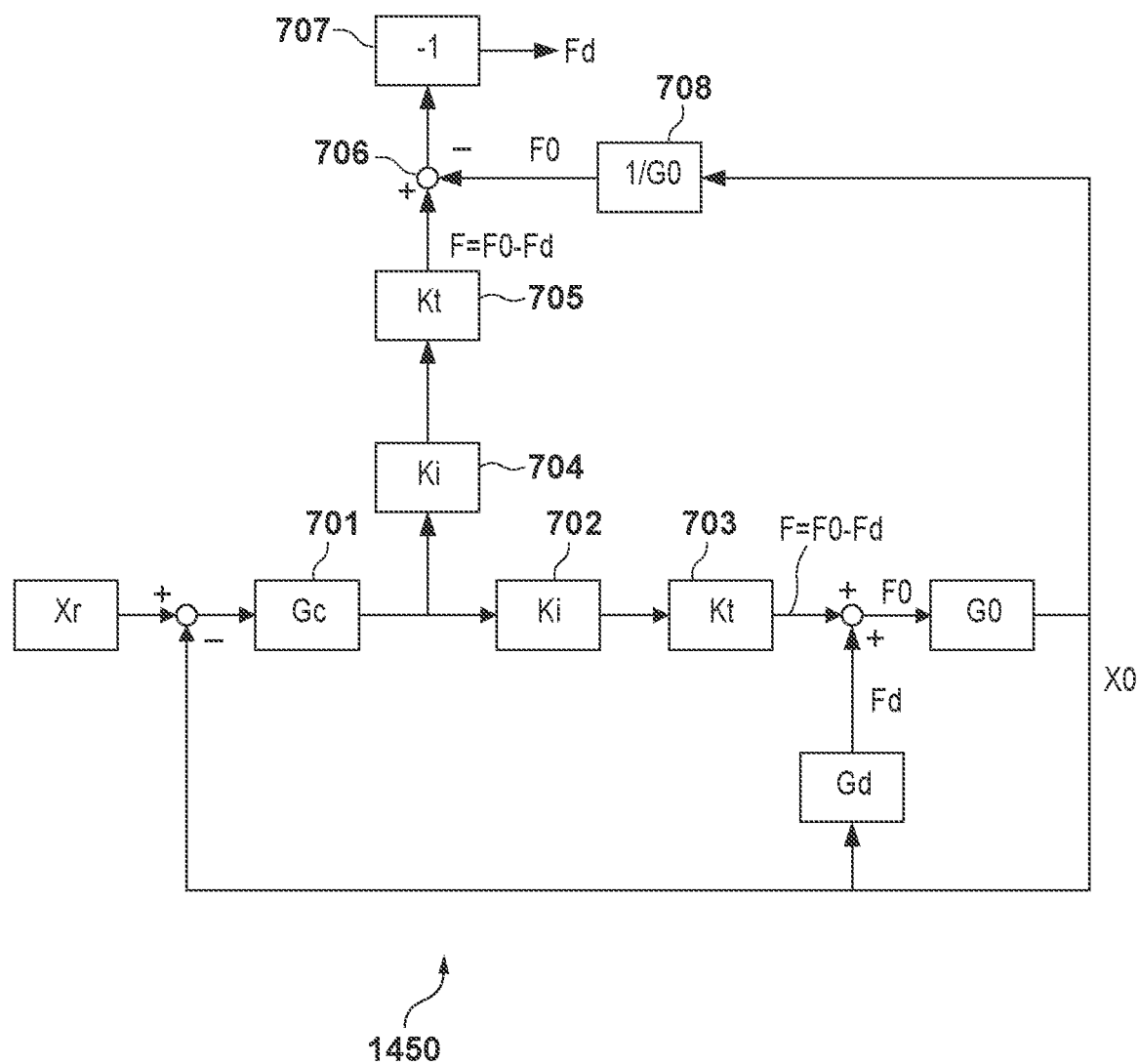
FIG. 7 is a block diagram showing the arrangement of a position feedback control system according to the first embodiment.

In addition, the disturbance force Fd applied to the processor 1010 can be calculated, in a state in which the processor 1010 is controlled by position feedback control, based on the displacement X0 of the processor 1010 and the output F output from the driver 1015 at this time. FIG. 7 shows a block diagram showing the arrangement and the operation of the control apparatus 1100 in a state in which the position feedback control of the processor 1010 is performed. The control apparatus 1100 shown in FIG. 7 includes an acquirer 1450 for acquiring the disturbance force Fd. Reference symbol Xr represents a displacement target value (position command value) of the processor 1010. Since the output F output by the driver 1015 will be F=F0–Fd when position feedback control is performed on the processor 1010, the driving force F0 will be applied to the processor 1010 even if the disturbance force Fd is applied. Hence, the processor 1010 can be positioned according to the displacement target value Xr.

Therefore, the disturbance force Fd can be obtained by subtracting the driving force F0 from the output F (=F0–Fd) and multiplying the obtained result by −1. The driving force F0 can be obtained by multiplying the displacement X0 of the processor 1010 by 1/G0.

When acquiring the disturbance force Fd, the acquirer 1450 executes position feedback control of driving the driver 1015 based on the difference between the displacement target value Xr and the displacement X0 so that the displacement X0 (measured value) of the processor 1010 will match the displacement target value Xr for commanding the position of the processor 1010. In this position feedback control, the acquirer 1450 acquires the disturbance force Fd based on the difference between the displacement target value Xr and the displacement X0 and the displacement X0 (measured value). In the example of FIG. 7, the output F is operated based on the difference between the displacement target value Xr and the displacement X0, the driving force F0 is operated based on the displacement X0 (measured value), and the disturbance force Fd is operated from the output F and the driving force F0. Note that reference numerals 701 to 708 denoted in FIG. 7 indicate a correspondence relationship with the components shown in FIG. 14 to be described below.

Figure 14:
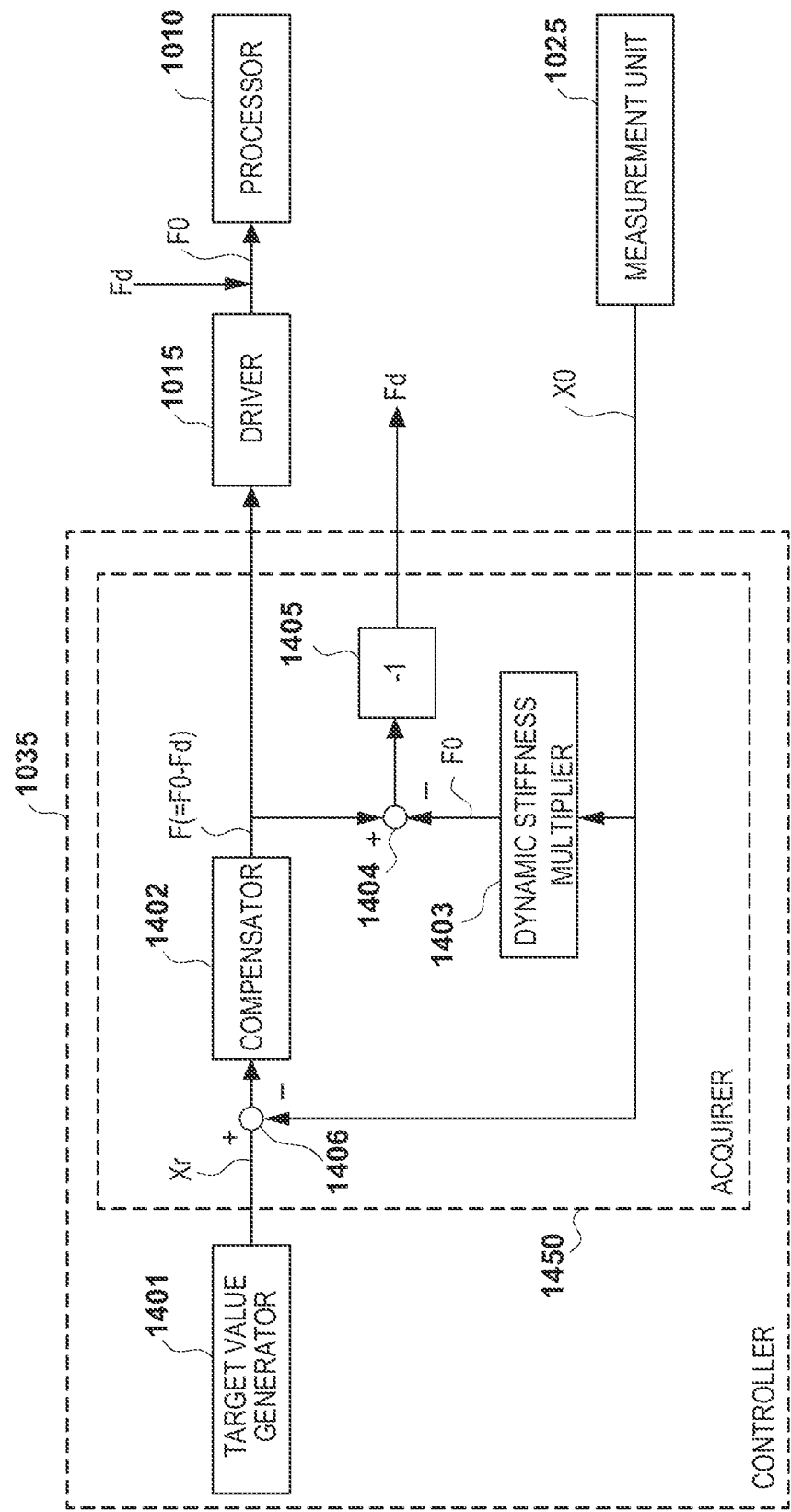
FIG. 14 is a block diagram for explaining FIG. 7 by using specific devices.

FIG. 14 shows an example of the physical arrangement of the control apparatus 1100 corresponding to FIG. 7. The controller 1035 can include a target value generator 1401, a compensator 1402, a dynamic stiffness multiplier 1403, and operators 1404, 1405, and 1406. The target value generator 1401 generates the displacement target value Xr (position command value). The operator 1406 operates the difference (deviation of displacement) between the displacement target value Xr and the displacement X0. The compensator 1402 obtains the driving force F (=F0–Fd) from the difference (deviation of displacement) between the displacement target value Xr and the displacement X0. The compensator 1402 corresponds to a block formed by the control compensator Gc (701), the current gain Ki (702), and the thrust constant Kt (703) of FIG. 7, and its gain is GcKtKi. The operator 1404 corresponds to the operator 706 of FIG. 7. In FIG. 7, the driving force F (=F0–Fd) calculated by the block formed by the control compensator Gc (701), the current gain Ki (704), and the thrust constant Kt (705) is input to the operator 706. The operator 1405 corresponds to the operator 707 of FIG. 7. The dynamic stiffness multiplier 1403 corresponds to 1/G0 (708) of FIG. 7. The compensator 1402, the dynamic stiffness multiplier 1403, and the operators 1404, 1405, and 1406 form the acquirer 1450 for acquiring the disturbance force Fd. The determiner 1350 shown in FIG. 13 determines, by machine learning based on the disturbance force Fd acquired by the acquirer 1450, a plurality of parameter values to be used by the disturbance estimator 1305. The plurality of parameter values here will be used to obtain the estimated disturbance force Fde based on the information related to the state of the processor 1010.

In order for the estimated disturbance force Fde, which is generated by the disturbance estimator 1305, to be a value that correctly estimates the disturbance force Fd, the plurality of parameter values of the disturbance estimator Gde need to be correctly determined. If the disturbance estimation model is the three three-element model shown in FIG. 6, the total number of springs and damper elements will be 9, and it will be very difficult to determine 9 parameter values by calculating on paper. Hence, in the first embodiment, the determiner 1350 will determine the plurality of parameter values of the disturbance estimator Gde by machine learning. For example, unsupervised learning can be used as the machine learning method. A function for executing machine learning can be embedded in, for example, the controller 1035.

First, to execute machine learning, the controller 1035 will acquire data to be used for training. The position feedback control of the processor 1010 will be performed to collect, as data, the disturbance forces Fd of various kinds of displacements X0 and the displacement X0 of the processor 1010. The collected data of the displacements X0 will be set as displacement data data_X0 and the collected data of disturbance forces Fd will be set as the disturbance force data data_Fd. The controller 1035 will input the displacement X0 in the disturbance estimator Gde and collect the estimated disturbance force Fde output from the disturbance estimator Gde as estimated disturbance force data data_Fde. The controller 1035 will use data collected in this manner as the training data.

In unsupervised learning, it is desirable to make the estimated disturbance force Fde match the disturbance force Fd as much as possible. Hence, the controller 1035 can be formed to set, as a loss function L, a function for obtaining a mean squared error of the estimated disturbance force Fde and the estimated disturbance force Fde, and optimize the plurality of parameter values of the disturbance estimator Gde so as to minimize the loss function L. The loss function L can be expressed as $$L = \sum_{i=1}^{n} \{Fde(i) - Fd(i)\}^2 \quad (15)$$

where i is a data number of the training data, and n is a total number of the training data.

A function that obtains, other than the mean squared error, for example, an average mean squared error, a mean absolute error, or a mean squared logarithmic error can be employed as the loss function.

Figure 8A:
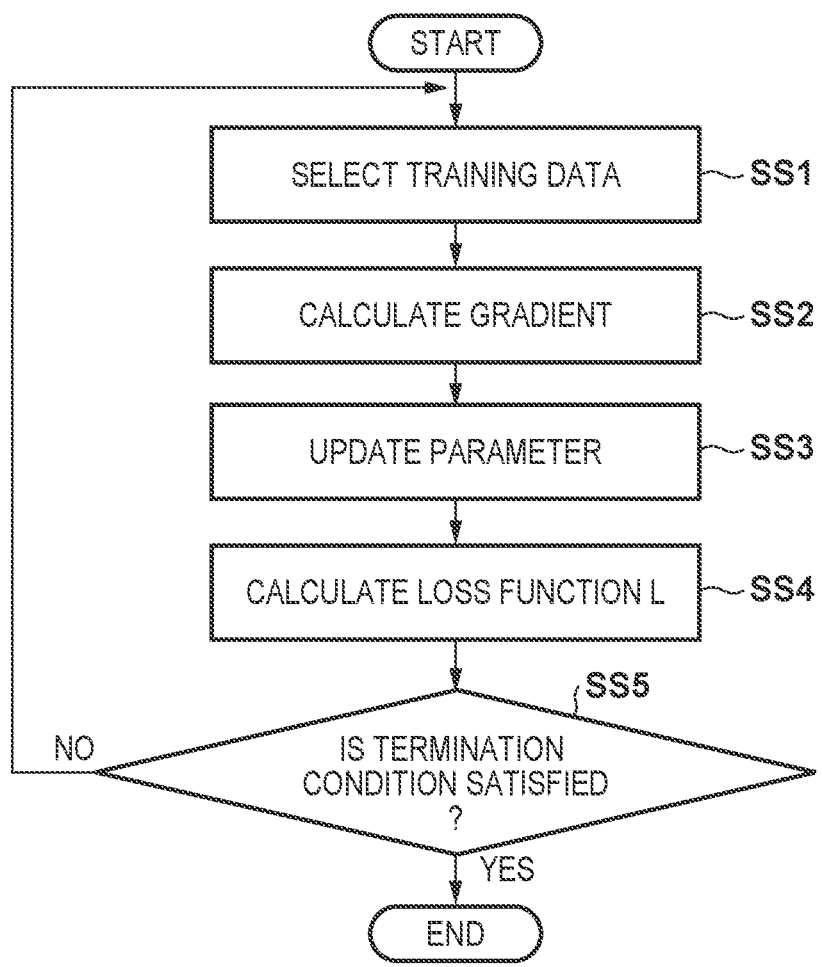
FIGS. 8A and 8B are flowcharts for showing a machine learning method according to the first embodiment.

An example of an optimization method to be employed in machine learning will be described next. For example, a gradient method can be used as the optimization method in machine learning. FIG. 8A shows an example of the procedure of the gradient method. First, in step SS1, the controller 1035 selects training data for learning from the collected training data. The training data for learning may be selected randomly from the collected training data or training data which is well characterized by a feature desired to be learned may be selected. Next, in step SS2, to reduce the value of the loss function, the controller 1035 obtains the gradient of each parameter value. Letting L be the value of the loss function, the gradient of each parameter value can be expressed as, for example.

$$\frac{\partial L}{\partial K, \partial C} = \begin{bmatrix} \frac{\partial L}{\partial K11} \\ \vdots \\ \frac{\partial L}{\partial C32} \end{bmatrix} \quad (16)$$

Next, in step SS3, the controller 1035 updates each parameter value by an infinitesimal amount in the direction of the gradient. The updating of each parameter value can be performed in accordance by $$K11 = K11 - \eta \cdot \frac{\partial L}{\partial K11} \quad (17)$$
$$\vdots$$
$$C32 = C32 - \eta \cdot \frac{\partial L}{\partial C32}$$

where η represents a learning rate and is a parameter that determines the degree to which the parameter value is to be updated in one learning operation. In general, the learning rate η can be about 0.001 to 0.1.

In step SS4, the controller 1035 calculates the loss function L of the updated parameter values. In step SS5, the controller 1035 determines whether the termination condition has been satisfied. If the termination condition has been satisfied, the learning will end. Otherwise, the process will return to step SS1, and the learning will be continued.

Figure 8B:
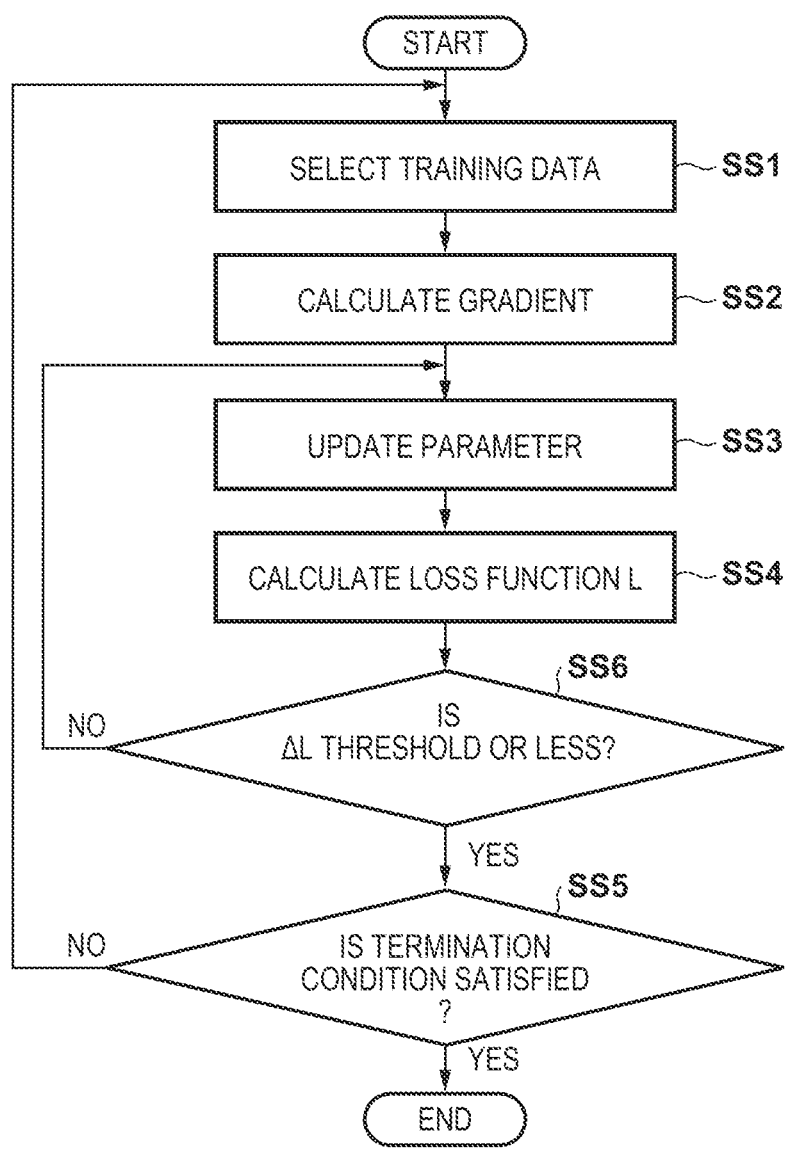

FIG. 8B shows another example of the procedure of a gradient method which is obtained by partially changing the procedure of the gradient method shown in FIG. 8A. In the procedure of the gradient method shown in FIG. 8B, a step SS6 in which an amount ΔL of change of the loss function L with respect to a stored loss function Lold is calculated and whether the amount ΔL of change is a threshold or less is determined has been added as shown by $$\Delta L = |L - Lold| \quad (18)$$

If the amount ΔL of change is not the threshold or less, the process will return to step SS3 to update the parameter values, and the loss function L will be calculated in step SS4. The procedure of FIG. 8B is a method in which the parameter values are continuously changed in the direction of the gradient once the gradient has been obtained and the direction of advancement has been determined, and the parameter values are updated by obtaining a new gradient when the reduction of the loss function L has stopped. This method can obtain an optimal solution that will minimize the loss function L more quickly than the procedure shown in FIG. 8A.

The learning rate η can be gradually decreased in accordance with the degree of progress of the learning operation. This will allow the parameter values to be changed greatly in a case in which the parameter values are far from an optimal solution, and the parameter values to be changed finely in a case in which the parameter values have become close to the optimal solution. As result, the optimal solution can be reached more quickly and more accurately.

Although the gradient method is used as the optimization method of machine learning in the first embodiment, another optimization method may also be employed.

The processing for determining the parameter values of the disturbance estimator Gde may be executed while the control apparatus 1100 is operated (while the workpiece 1001 is processed) or may be executed by driving the processor 1010 in accordance with a dedicated driving profile during a non-operating time. In a case in which the parameter values of the disturbance estimator Gde are to be determined during the non-operating time, the processing for determining the parameter values of the disturbance estimator Gde can be executed, for example, periodically, at an arbitrary timing, or when a predetermined condition has been satisfied. For example, in a case in which an error of the estimated disturbance force Fde with respect to the disturbance force Fd has exceeded a predetermined ratio (for example, 5%), the parameter values of the disturbance estimator Gde can be updated or redetermined.

Figure 9:
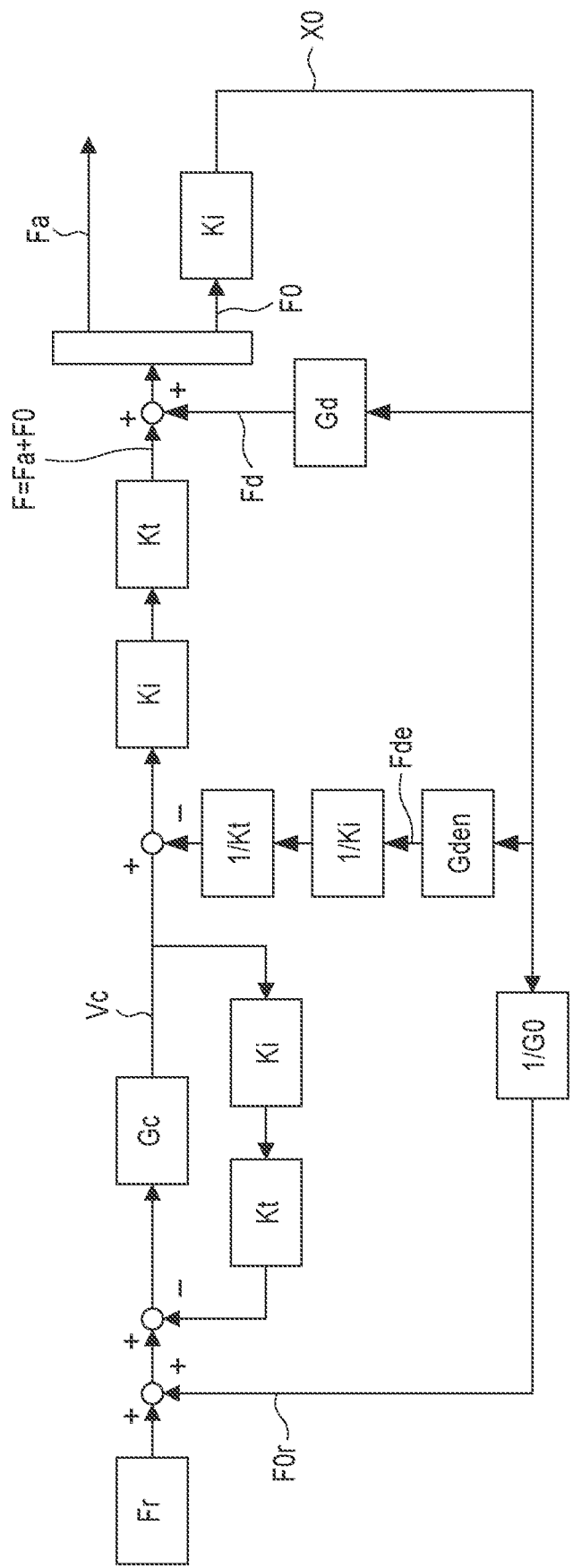
FIG. 9 is a block diagram showing the arrangement of a force feedback control system that has performed disturbance force correction according to the second embodiment.
Figure 10:
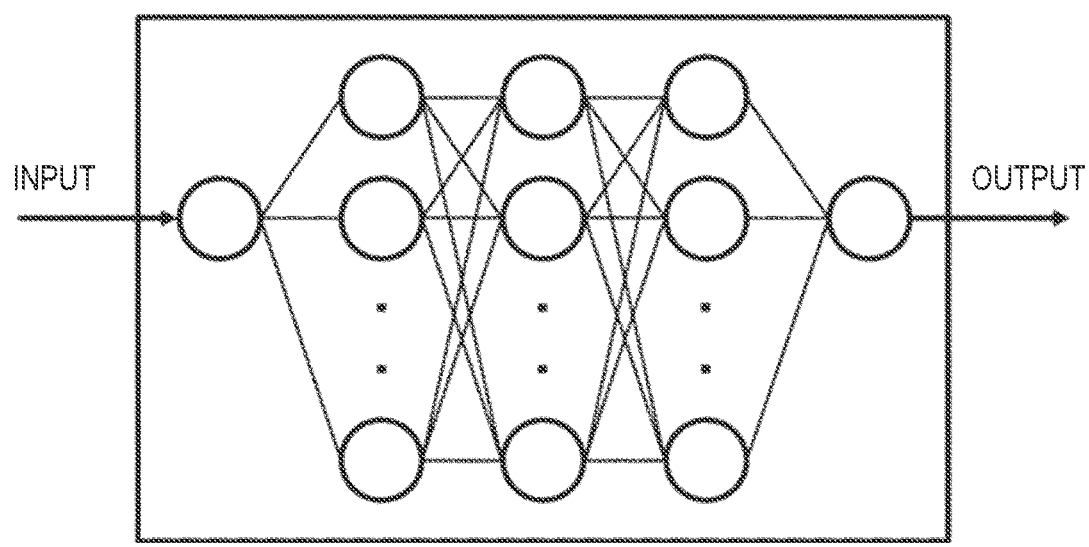
FIG. 10 is a schematic view showing a neural network.

FIG. 9 shows a block diagram showing the arrangement of a force feedback control system that performed disturbance force correction according to the second embodiment. In place of a disturbance estimator Gde of the first embodiment, a disturbance estimator Gden formed by a neural network can be used in the second embodiment. The disturbance estimator Gden can include a input layer, a plurality of intermediary layers, and an output layer as exemplified in FIG. 10. The total number of intermediary layers and the number of nodes of each layer can be set appropriately. The optimization of the parameter values of the disturbance estimator Gden can be performed by using, for example, a method similar to the method for determining the parameter values of the disturbance estimator Gde according to the first embodiment. Disturbance estimation can be performed more accurately by using the disturbance estimator Gden formed by a neural network than by using the disturbance estimator Gde which uses a three element model.

Parameter values of a disturbance estimator Gde according to the first embodiment will be determined by using reinforcement learning in the third embodiment. Although values of various kinds of formats can be used as a reward to be a target during learning in reinforcement learning, an example of learning by "a behavior evaluation function $Q^\pi(s, a)$" will be exemplified. The behavior evaluation function $Q^\pi(s, a)$ can be expressed as follows.

$$Q^\pi(s, a) = E_\pi\left\{\sum_k \gamma^k r_{t+1+k} | s_t = s, a_t = a\right\} \quad (19)$$

where t represents a time, s represents a state, $\underline{a}$ represents an action, π represents a policy, $E_\pi\{\ \}$ represents an expected value under the policy π, r represents a reward, γ represents a discount factor of a future reward, and k represents a time until a future reward.

An agent of action, that is, a controller 1035 in this case will behave to maximize the behavior evaluation function $Q^\pi(s, a)$ of equation (19). At this time, the agent will select and execute "an optimal behavior based on past experience" and "a search for a new behavior" to pursue further reward obtainment in accordance with the predetermined policy π. Since the equation is set as an expected value with consideration to a future reward, it will be possible to deal with a state in which a large reward can be obtained in the long term although the reward will decrease in the short term. As a result, the agent can learn the state and behavior that can maximize the behavior evaluation function $Q^\pi(s, a)$.

The reward of the behavior evaluation function $Q^\pi(s, a)$ shown in equation (19) can be defined as a reciprocal of the evaluation function of equation (15) as follows.

$$r = \frac{1}{L} = \frac{1}{\sum_{i=1}^n (Fde - Fd)^2} \quad (20)$$

Equation (20) is an equation that expects the reward r to increase if the disturbance force Fde estimated by the disturbance estimator Gde is close to the actual disturbance force Fd.

For example, the action $\underline{a}$ can be defined as follows. The number of actions $\underline{a}$ will be 9×2=18 as the number of parameters.

$$a_j = \{a_{j1}, \ldots, a_{j18}\} \quad (21)$$

$a_{j1}: K11 \to K11 + \Delta K11$ $a_{j2}: K11 \to K11 - \Delta K11$ $\vdots$ $a_{j17}: C32 \to C32 + \Delta C32$ $a_{j18}: C32 \to C32 - \Delta C32$ where j represents a number of epochs. The action $\underline{a}$ is a behavior that can increase or decrease the attenuation coefficient and the spring constant of the disturbance estimation model by an infinitesimal amount ΔK and an infinitesimal amount ΔC, respectively, to find parameter values optimal for the disturbance estimator Gde. The sizes of ΔK and ΔC can be obtained by multiplying the spring constant and the attenuation coefficient, respectively, of the initial state by a predetermined ratio, and this ratio can fall within a range of, for example, about 0.1% to 10%. Note that the behavior is not limited to the action $\underline{a}$ as long as it is a behavior that allows for optimal parameter values of the disturbance estimator Gde to be searched, and another behavior may be defined.

The policy π can be defined as follows.

Policy π: an action $a_i$ will be randomly selected, and the parameter values of the disturbance estimator Gde will be updated if the behavior evaluation function $Q^\pi(s, a)$ increases.

Here, without consideration to the future reward, the behavior evaluation function $Q^\pi(s, a)$ may be made equal to the reward r by setting the time k to the future reward to 0 and the discount factor γ of the future reward as 0.01.

The parameter values of the disturbance estimator Gde are updated based on a randomly selected action $a_{jh}$ (h is one of 1 to 18). If the behavior evaluation function $Q^\pi(s, a)$ at this time has increased more than the behavior evaluation function $Q^\pi(s, a)$ of an initial state $s_0$, the parameter values of the disturbance estimator Gde of a state $s_1$ at t=1 will be updated. On the other hand, if the behavior evaluation function $Q^\pi(s, a)$ at this time has not increased more than the behavior evaluation function $Q^\pi(s, a)$ of the initial state $s_0$, the parameter values of the disturbance estimator Gde of the state $s_1$ at t=1 will not be updated. In this manner, the parameter values of the disturbance estimator Gde are updated when the behavior evaluation function $Q^\pi(s, a)$ is better than the previous behavior evaluation function $Q^\pi(s, a)$. As a result, the parameter values of the disturbance estimator Gde can be optimized so that the behavior evaluation function $Q^\pi(s, a)$ will increases as the time t advances under the policy $\pi$ Since the time t is equivalent to the number of epochs in this case, the progression of the time t by one degree can be referred to as "performing one cycle of learning".

The definition of the policy $\pi$ is not limited to the example described above. An arbitrary condition such as not selecting a behavior that will shift to a search completed state or the like may be added. The time k until a future reward may be set to a value equal to 1 or more, and the behavior evaluation function $Q^\pi(s, a)$ may be maximized based on accumulated information. In such a case, the parameter values of the disturbance estimator Gde can be determined in a state in which the number of epochs until optimization will increase, but will not be stuck to a local solution.

Figure 15:
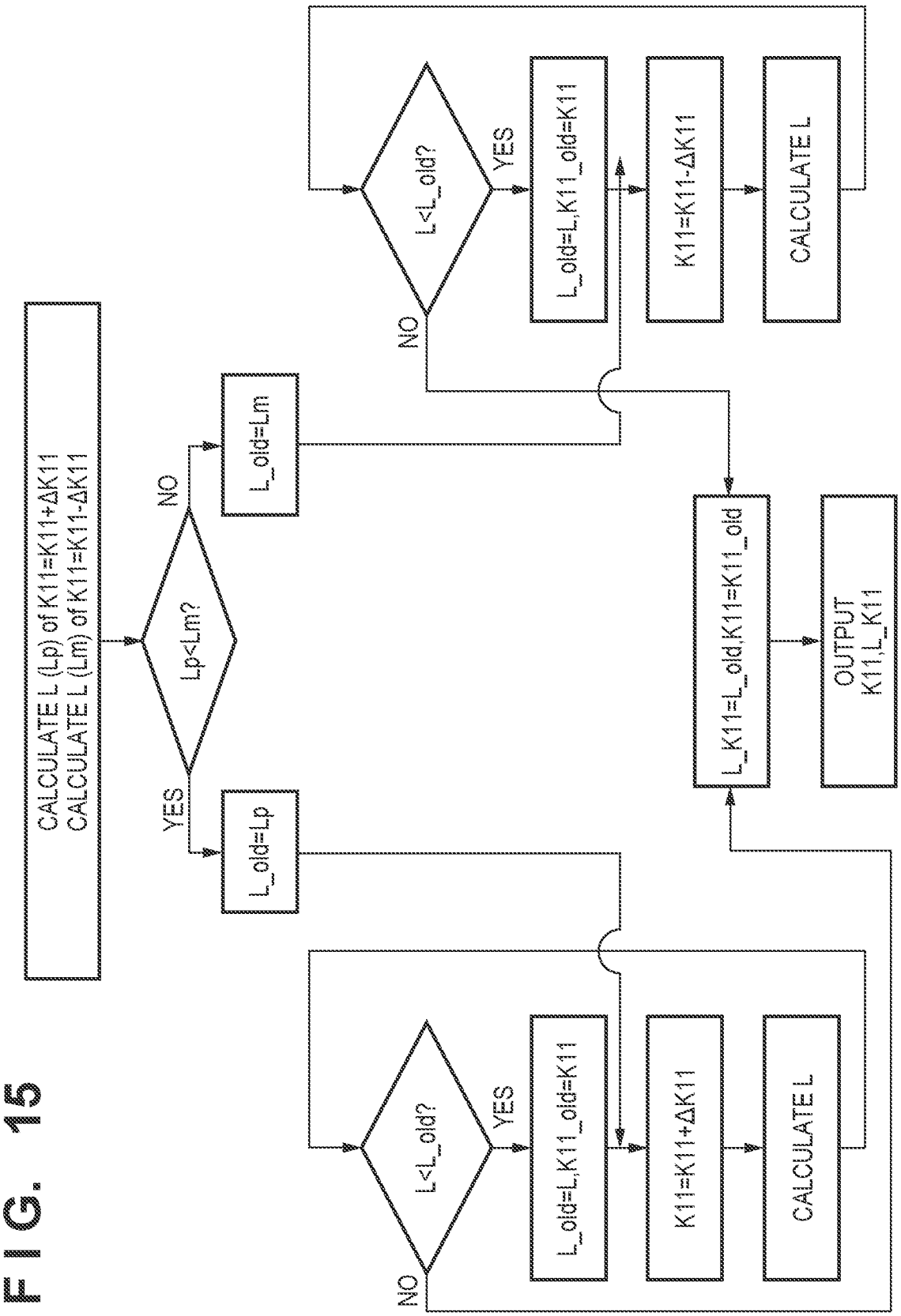
FIG. 15 is a flowchart for explaining an optimization method according to the fourth embodiment.

In the fourth embodiment, parameter values of a disturbance estimator Gde according to the first embodiment are determined not by machine learning, but by an optimization method. FIG. 15 shows an example in which K11 is optimized by the optimization method. A controller 1035 will calculate a loss function Lp of a case in which the parameter K11 has been increased by ΔK11 and a loss function Lm of a case in which K11 has been decreased by ΔK11. Subsequently, the controller 1035 will compare Lp and Lm, and will change K11 in a direction which can make a loss function L smaller. A case in which Lp is smaller will be exemplified here.

First, the controller 1035 will substitute Lp into L_old. Next, L of a case in which K11 is further increased by ΔK11 will be calculated. If L is smaller when L and L_old are compared, a loop in which L is calculated by substituting L into L_old to further increase K11 by ΔK11 and the resultant L and L_old are compared will be continued until the loss function L stops decreasing. If L is larger than L_old, the controller 1035 will exit the loop, substitute L_old into L_K11, and substitute K11_old into K11. Finally, K11 and L_K11 will be output.

Figure 16:
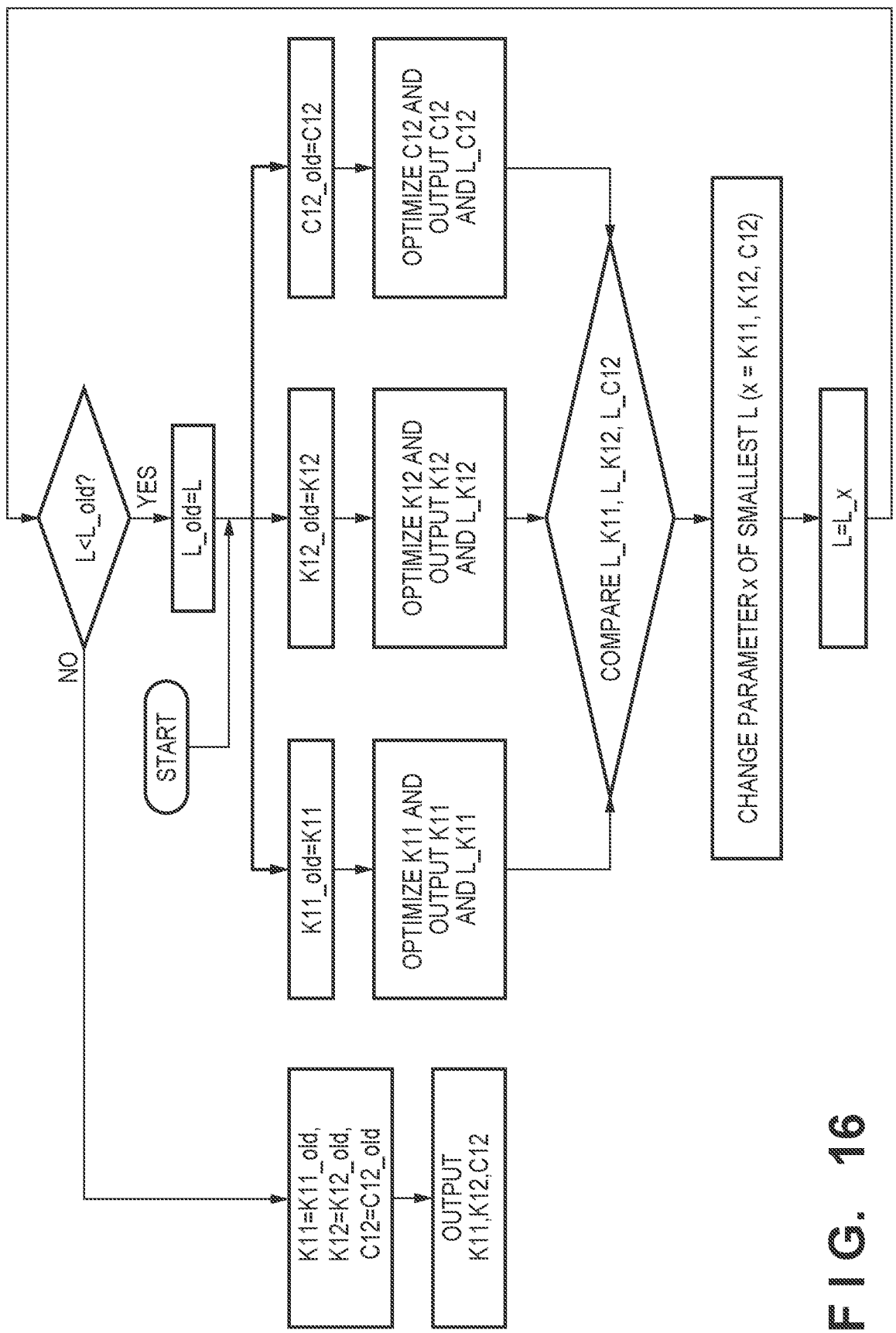
FIG. 16 is a flowchart for explaining the optimization method according to the fourth embodiment.

A method of optimizing the parameter values of a plurality of parameters will be described with reference to FIG. 16. In the example of FIG. 16, the parameter values of the parameters K11, K12, and C12 will be optimized. However, the parameter values of many more parameters may be simultaneously optimized, and the parameter values may be optimized by targeting several parameters as in the fourth embodiment.

In the example of FIG. 16, first, the controller 1035 will substitute the current K11, K12, and C12 into K11_old, K12_old, and C12_old, respectively. Next, the controller 1035 will optimize each of K11, K12, and C12, and output the optimized K11, K12, and C12 and their respective loss functions L_K11, L_K12, and L_C12. Furthermore, the controller 1035 will compare L_K11, L_K12, and L_C12, and change the parameter value of a parameter that can minimize the loss function L the most. For example, if L_K11 is smallest, the controller 1035 will change K11 and further substitute L_K11 into L. Next, the controller 1035 will compare L and L_old, substitute L into L_old if L is smaller than L_old, and further optimize each of K11, K12, and C12. A loop in which L_K11, L_K12, and L_C12 are compared and L is updated by changing the parameter value of a parameter that can minimize the loss function L will be continued until the loss function L stops decreasing. If L is larger than L_old, the controller 1035 will exit the loop and substitute K11_old into K11, K12_old into K12, and C12_old into C12. Subsequently, the controller 1035 will finally output K11, K12, and C12. In this manner, the parameter values of the parameters of the disturbance estimator Gde can be determined not by machine learning, but by using the optimization method.

Figure 11A:
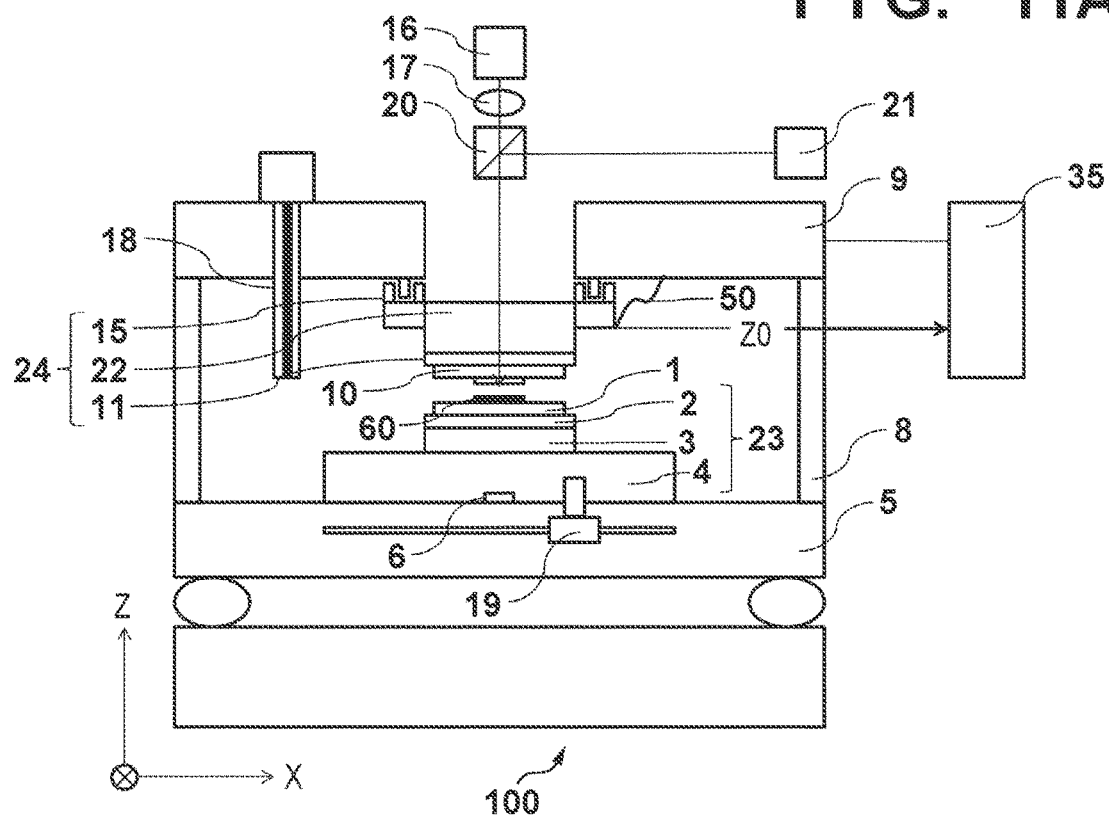
FIGS. 11A and 11B are schematic views each showing the arrangement of an imprint apparatus according to the fifth embodiment.
Figure 11B:
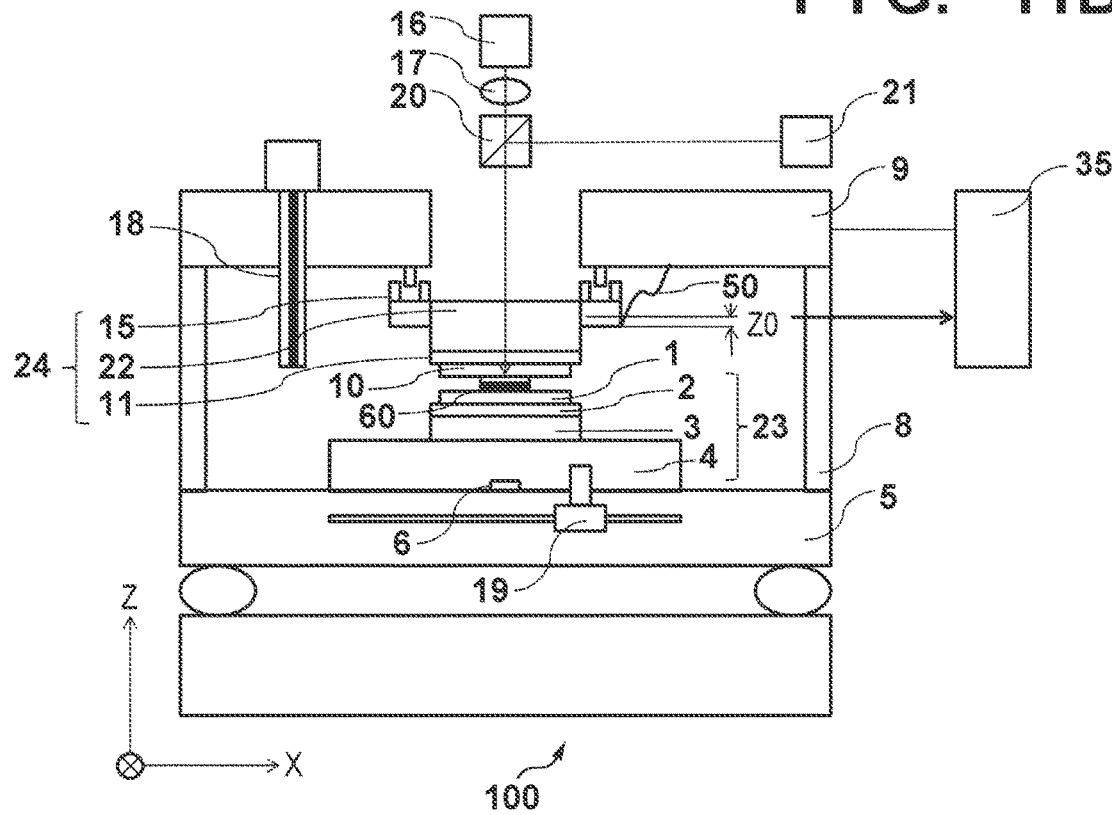

The fifth embodiment provides an example in which a disturbance estimator Gde or a control apparatus 1100 according to the first embodiment is applied to an imprint apparatus. FIGS. 11A and 11B schematically show the arrangement of an imprint apparatus 100 according to the fifth embodiment. FIG. 11A shows a state before a mold 10 and an imprint material 60 on a substrate 1 are in contact with each other, and FIG. 11B show a state in which the mold 10 and the imprint material 60 on the substrate 1 are in contact with each other. Assume hereinafter that two axes which are perpendicular to each other on a plane parallel to the surface of the substrate 1 are an X-axis and a Y-axis, and an axis perpendicular to the X-axis and the Y-axis is an Z-axis.

The imprint apparatus 100 can include a substrate manipulation unit 23 that holds the substrate 1, a supplier 18 that supplies the imprint material 60, a mold manipulation unit 24 that holds the mold 10, a light source 16, an alignment scope 21, and a controller 35. The imprint apparatus 100 brings the mold 10 and the imprint material 60 supplied onto the substrate 1 into contact with each other and applies curing energy to the imprint material 60 to form a pattern of a cured product in which a concave-convex pattern of the mold 10 has been transferred. The imprint apparatus 100 of FIGS. 11A and 11B can be used for manufacturing an article such as a semiconductor device.

The substrate manipulation unit 23 can include a substrate chuck 2, a θ stage 3 (rotation driver), and an XY stage 4 (XY driver). The substrate chuck 2 holds the substrate 1 by a vacuum suction force or a electrostatic suction force. In FIGS. 11A and 11B, the substrate 1 is held by the substrate chuck 2. The θ stage 3 corrects the position of the substrate 1 in a θ direction (a rotation direction about the Z-axis), and is arranged on the XY stage 4 for positioning the substrate 1 in the X direction and the Y direction. The XY stage 4 can be driven in the X direction and the Y direction by a linear motor 19. The θ stage 3 and the XY stage 4 hold the substrate chuck 2 and move the substrate 1 held by the substrate chuck 2. The XY stage 4 is placed on a base 5. A linear encoder 6 is attached on the base 5 in the X direction and the Y direction, and measures the position of the XY stage 4. A support column 8 stands on the base 5 and supports a top plate 9.

A single-crystal silicon substrate, an SOI (Silicon On Insulator) substrate, or the like can be used as the substrate 1. Glass, a ceramic, a metal, a semiconductor, a resin, or the like may also be used as the substrate 1, and a member or a layer made of a material different from a base material may be provided on the surface of the base material as needed. More specifically, the substrate can include a silicon wafer, a compound semiconductor wafer, or silica glass. The substrate 1 can include a plurality of shot regions, and the imprint material 60 can be supplied to the shot regions by the supplier 18. The imprint apparatus 100 can form a pattern on the entire surface of the substrate 1 by repeatedly performing an imprint process for forming an imprint material pattern on each shot regions.

A curable composition (to be also referred to a resin in an uncured state) to be cured by receiving curing energy is used as the imprint material 60. As the curing energy, an electromagnetic wave or heat can be used. The electromagnetic wave can be, for example, light selected from the wavelength range of 10 nm or more to 1 mm or less, for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component. In this embodiment, as one example, a photocurable composition that has a property of being cured by ultraviolet light will be used as the imprint material 60. The supplier 18 can arrange the imprint material 60 on the substrate 1 in the form of droplets or in the form of an island or film formed by connecting a plurality of droplets. The viscosity (the viscosity at 25° C.) of the imprint material can be, for example, 1 mPa·s or more to 100 mPa·s or less. The imprint material 60 may also be supplied onto the substrate in the form of a film by a spin coater or a slit coater.

The supplier 18 (dispenser) supplies the imprint material 60 on the substrate 1. The supplier 18 includes, for example, discharge nozzles (not shown), and supplies, from the discharge nozzles, the imprint material 60 onto the substrate 1. Note that in this embodiment, as one example, the supplier 18 will supply the imprint material onto the substrate 1 by discharging droplets of the liquid imprint material 60 onto the surface of the substrate 1. The amount of the imprint material to be supplied by the supplier 18 can be determined based on the thickness of the imprint material to be needed, the density of the pattern to be formed, and the like. In addition, the supplier 18 need not always be arranged in the imprint apparatus 100, and a supplier which is arranged outside the imprint apparatus 100 may supply the imprint material onto the substrate 1.

The mold 10 is a mold for forming the imprint material on the substrate. The mold can also be called a template or an original. The mold 10 includes, for example, a pattern region P that has a rectangular peripheral portion and whose surface facing the substrate 1 has a three-dimensionally formed convex-convex pattern, which is to be transferred to the imprint material 60 supplied on the substrate 1. The pattern region P is also referred to as a mesa portion. The pattern region P is formed as a convex portion of several 10 µm to several 100 µm so that the substrate 1 will not come into contact with a region (region surrounding the pattern region P) other than the pattern region P of the mold 10. The mold 10 is made of a material, for example, quartz or the like, which can transmit light (ultraviolet light) for curing the imprint material on the substrate.

The mold manipulation unit 24 can include a mold chuck (mold holder) 11, a mold stage 22, and a linear actuator 15 (mold driver). The mold chuck 11 holds the mold 10 by a vacuum suction force or an electrostatic suction force. The mold chuck 11 is held by the mold stage 22. The mold stage 22 has a function for adjusting the Z position of the mold 10 and a tilt function for correcting the tilt of the mold 10. The linear actuator 15 drives the mold 10 held by the mold chuck 11 in the Z-axis direction, brings the mold 10 into contact with the imprint material 60 on the substrate 1, and separates the mold 10 from the imprint material 60. The linear actuator 15 is, for example, an air cylinder or a linear motor. Note that each of the mold chuck 11 and the mold stage 22 includes an opening (not shown) to allow the light emitted from the light source 16 to pass through to the mold 10.

In the process for curing the imprint material 60 on the substrate 1, the light source 16 irradiates the substrate 1 with light (ultraviolet light) for curing the imprint material 60 via a collimator lens 17a. The light source 16 can be, for example, a light source that generates an i-ray (365 nm), but may also be a light source that generates light of another wavelength. A beam splitter 20 is arranged on an optical path between the light source 16 and the mold manipulation unit 24, and separates the light for curing the imprint material 60 from the light to be used for observing the contact state of the mold 10 by the alignment scope 21. The alignment scope 21 captures the pattern region P of the mold 10 via the beam splitter 20.

The controller 35 controls the operation and the adjustment of each unit that forms the imprint apparatus 100. The controller 35 can be formed by, for example, a computer or the like, be connected to each unit that forms the imprint apparatus 100 via a communication path, and execute control of each unit in accordance with a program or the like. The controller 35 may be arranged in the imprint apparatus 100 or may be installed in a separate location from the imprint apparatus 100 and remotely control the imprint apparatus 100.

Figure 12:
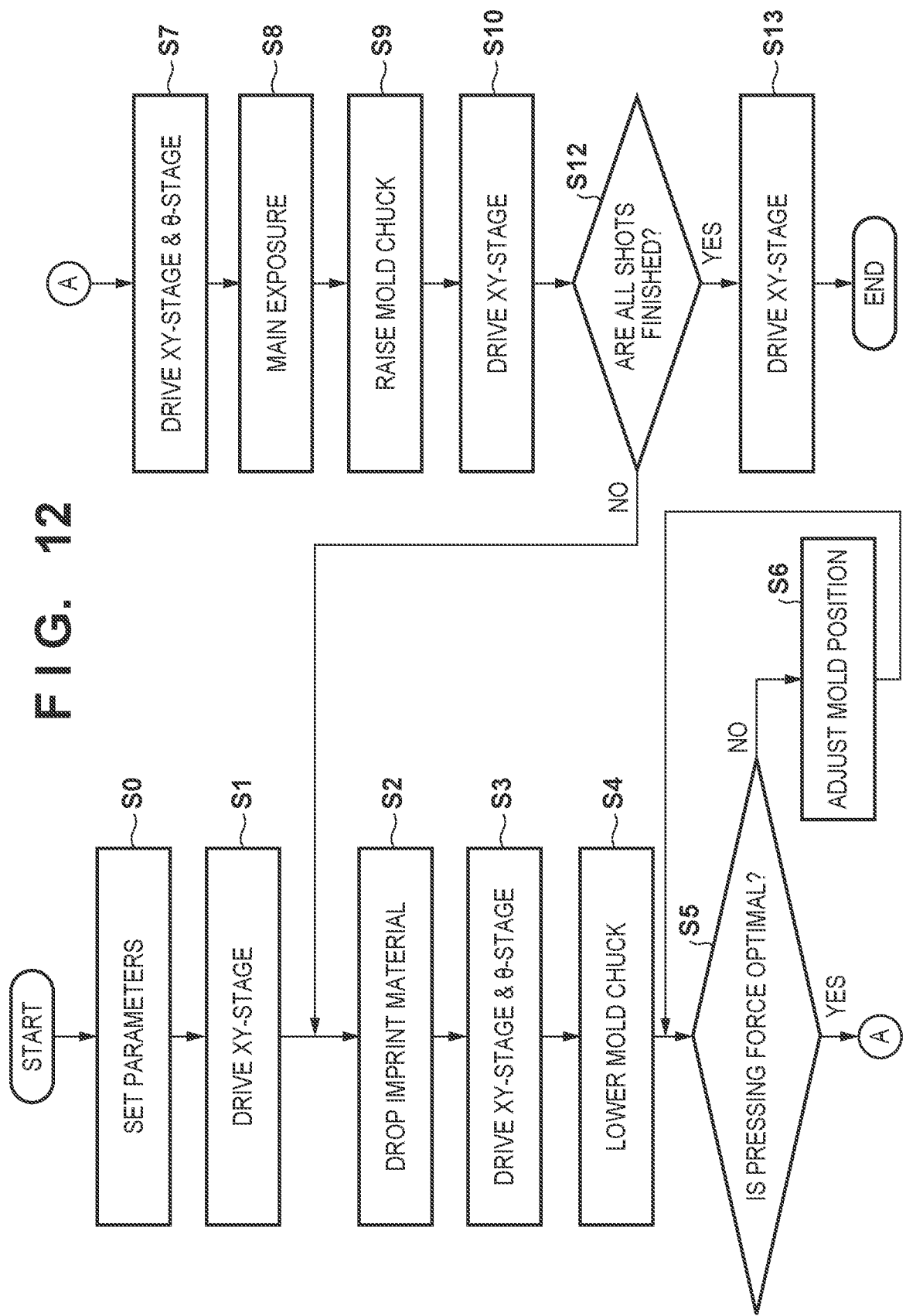
FIG. 12 is a flowchart showing an imprint process performed in the imprint apparatus according to the fifth embodiment.

The imprint process performed by the imprint apparatus 100 formed in the above-described manner will be described next. FIG. 12 is a flowchart showing the imprint process performed in the imprint apparatus 100 according to the fifth embodiment. Each step can be executed based on the control of each unit of the imprint apparatus 100 by the controller 35. First, various kinds of parameters necessary for the imprint process are set (step S0). Thereafter, the substrate chuck 2 on which the substrate 1 is placed is moved in the X direction and the Y direction by driving the XY stage 4 of the imprint apparatus 100 so that a shot region (target shot region) to be the target of the imprint process will be arranged bellow the supplier 18 (step S1). Subsequently, the predetermined amount of uncured imprint material 60 is supplied to the substrate 1 (step S2).

Next, the substrate chuck 2 is moved again by driving the XY stage 4 so that the target shot region will be arranged in a position that will face the pattern region P of the mold 10, and the position of the substrate 1 in the θ direction is corrected by driving the θ stage 3 (step S3). Subsequently, the mold 10 is brought into contact with the uncured imprint material 60 on the substrate 1 by driving the linear actuator 15 to move the mold stage 22 in the −Z direction (contact process, step S4). In step S4, instead of moving the mold stage 22, the substrate chuck 2 may be moved in the Z direction or each of the mold stage 22 and the substrate chuck 2 may be moved. The controller 35 determines whether a contact force generated when the mold 10 and the uncured imprint material 60 on the substrate 1 are brought into contact is optimal (step S5).

If it is determined that the contact force is not optimal (NO in step S5), the mold stage 22 will change the tilt of the mold chuck 11 so that the contact force between the mold 10 and the imprint material 60 will be a predetermined value. In addition, the force used to press the mold 10 against the imprint material is adjusted by changing the pressing amount of the linear actuator 15 (step S6).

If it is determined that the contact force is optimal (YES in step S5), the alignment scope 21 will detect alignment marks AM formed on the mold 10 and the substrate 1, and positioning will be performed based on the detected measurement result. Positioning of the mold 10 and the substrate 1 is performed by obtaining a relative shift between the mold 10 and the substrate 1 from the measurement result and driving the XY stage 4 and the θ stage 3 (step S7).

After positioning the mold 10 and the substrate 1, the light source 16 irradiates (exposes) the imprint material 60 on the substrate 1 with light (ultraviolet light) to cure the imprint material 60 (step S8). The irradiation region of this main exposure operation is the entire surface of the shot region. After light (ultraviolet light) irradiation is performed for a predetermined time and completed, a mold releasing step (step S9) of separating the mold 10 from the cured imprint material 60 on the substrate 1 is performed by driving the linear actuator 15 to move the mold stage 22 upward in the +Z direction. In step S9, instead of moving the mold stage 22, the substrate chuck 2 may be moved in the Z direction or each of the mold stage 22 and the substrate chuck 2 may be moved.

Subsequently, whether pattern formation has been completed for all of the shot regions on the substrate 1 is determined (step S12). If a shot region in which an imprint material pattern is to be formed remains, the XY stage 4 will be driven to move the substrate 1 so that the imprint material 60 will be supplied to the next target shot region (step S1). These series of processes are repeated until pattern formation is completed for all of the shot regions on the substrate 1. When pattern formation has been completed for all of the shot regions, the substrate 1 will be moved to a predetermined position by driving the XY stage 4 (step S13), and the imprint process of one substrate 1 is ended.

Although the force used to press the mold 10 against the imprint material is adjusted in step S6, an feeder 50 for supplying electric power and a fluid is connected to the mold manipulation unit 24, and the feeder 50 can apply a disturbance force to the mold manipulation unit 24. Hence, in the fifth embodiment, the controller 35 will include the disturbance estimator Gde, and a displacement ZO of the mold stage 22 measured by a position measurement device (not shown) of the mold manipulation unit 24 will be supplied to the disturbance estimator Gde. Subsequently, the disturbance estimator Gde can obtain an estimated disturbance force Fde, and a manipulation voltage Vc can be corrected based on the disturbance estimator Gde. The disturbance estimator Gde uses a plurality of three-element models, and unsupervised learning of machine learning can be used for the determination of the parameter values of the disturbance estimator Gde in a manner similar to the first embodiment.

In the sixth embodiment, a disturbance estimator Gden according to the second embodiment is applied to an imprint apparatus. The disturbance estimator Gden is formed by a neural network, and unsupervised learning of machine learning can be used for the determination of the parameter values of the disturbance estimator Gden in a manner similar to the second embodiment.

In the seventh embodiment, a disturbance estimator Gde according to the third embodiment is applied to an imprint apparatus. The disturbance estimator Gde uses a plurality of three-element models, and reinforcement learning can be used for the determination of the parameter values of the disturbance estimator Gde in a manner similar to the third embodiment.

In the first to seventh embodiments, a disturbance estimator can estimate the disturbance to be applied to the processor 1010 or the mold manipulation unit 24 and a manipulation amount can be corrected based on this estimation. However, since various kinds of disturbance causes influence each other in a complicated manner in an imprint apparatus, the overlay accuracy may not be improved by executing correction based only on the disturbance force of the feeder 50. Hence, in the eighth embodiment, in order to estimate a disturbance force in the contact process for bringing the mold into contact with the imprint material on the substrate, the parameter values of the disturbance estimator are determined by using disturbance force data data_Fdimp which is calculated based on a measurement result obtained by an overlay inspection apparatus. A neural network or the like can be used as the disturbance estimator. As values to be input to the disturbance estimator, a manipulation voltage Vcimp to a linear actuator 15 for driving a mold chuck 11 can also be used in addition to a displacement ZO of the mold chuck 11 during the imprint process. Based on the displacement ZO and the manipulation voltage Vcimp, the disturbance estimator can output an estimated disturbance force Fdeimp. Since the disturbance force data data_Fdimp is a value output for each shot region, the estimated disturbance force Fdeimp at the time of the contact process can also be collected for each shot region to set estimated disturbance force data data_Fdeimp. The parameter values of the disturbance estimator can be determined by executing, in a manner similar to the second embodiment, unsupervised learning of machine learning by using the disturbance force data data_Fdimp at the time of the contact process and the estimated disturbance force data data_Fdeimp as training data. As a result, a disturbance at the time of an imprint process that can influence the overlay accuracy can be estimated by the disturbance estimator, and the overlay accuracy can be improved by correcting the manipulation amount based on the disturbance.

In the ninth embodiment, reinforcement learning is used in a manner similar to the third embodiment for the determination of parameter values of a disturbance estimator according to the eighth embodiment.

A method of manufacturing an article will be described as the 10th embodiment hereinafter. The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 17A:
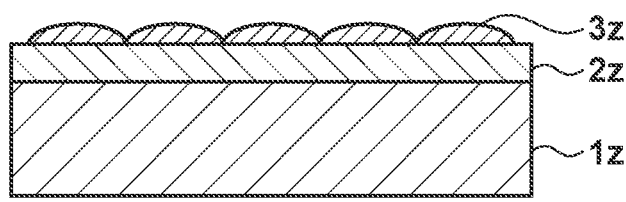
FIGS. 17A to 17F are views for explaining a method of manufacturing an article.

A method of manufacturing an article in which the above-described imprint apparatus forms a pattern on a substrate, processes the substrate on which the pattern is formed, and manufactures an article from the processed substrate will be described next. As shown FIG. 17A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 17B:
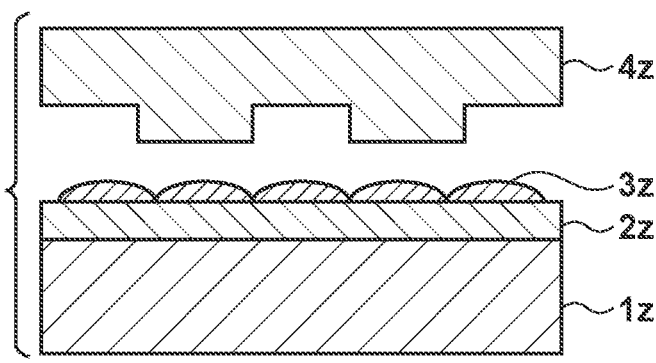
Figure 17C:
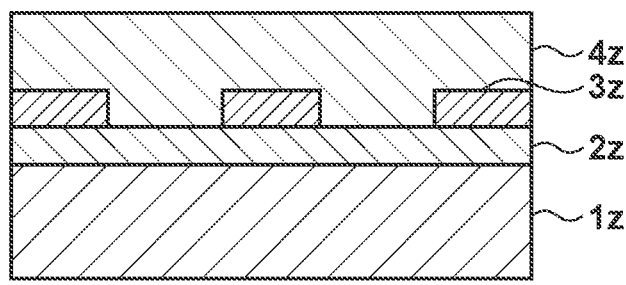

As shown in FIG. 17B, a side of a mold 4z for imprint with a concave-convex pattern is directed toward and made to face the imprint material 3z on the substrate. As shown FIG. 17C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 17D:
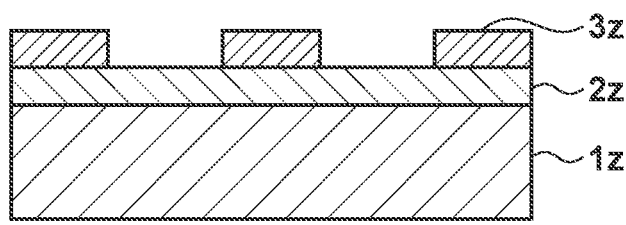

As shown in FIG. 17D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 17E:
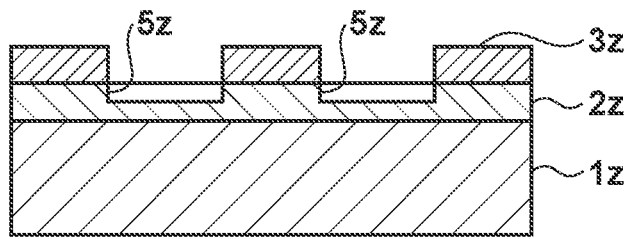
Figure 17F:
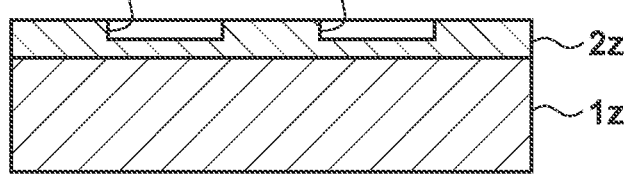

As shown in FIG. 17E, when etching is performed using the pattern of the cured product as an etching resistant mask, a portion of the surface of the processed material 2z where the cured product does not exist or remains thin is removed to form a groove 5z. As shown in FIG. 17F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-144872, filed Aug. 28, 2020, which is hereby incorporated by reference herein in its entirety.

What is claimed is:

1. A control apparatus that controls a force applied to an object, comprising:
   a driver configured to apply the force to the object;
   an estimator configured to estimate, based on information related to a state of the object, a disturbance force to be applied to the object via a member connected to the object, using a model that includes a plurality of parameter values indicating one or more characteristics of an attenuation and a stiffness regarding the member; and
   a corrector configured to correct a command value provided to the driver so as to reduce an influence of the disturbance force estimated by the estimator,
   wherein the model includes a three element model comprising a first spring having a first end connected to the object, and a second spring and a damper which are arranged in parallel and serially connected to a second end of the first spring.

2. The apparatus according to claim 1, wherein the member is directly connected or indirectly connected to the object.

3. The apparatus according to claim 1, further comprising:
   a measurement unit configured to measure the information.

4. The apparatus according to claim 1, further comprising:
   a determiner configured to determine the plurality of parameter values to be used by the estimator; and
   an acquirer configured to acquire the disturbance force,
   wherein the determiner determines, based on the disturbance force acquired by the acquirer, the plurality of parameter values through machine learning.

5. The apparatus according to claim 4, wherein in position feedback control in which the driver is operated based on a difference between a position command value for commanding a position of the object and a measured value of the position of the object so that the position command value and the measured value will match, the acquirer acquires the disturbance force based on the difference and the measured value.

6. The apparatus according to claim 4, wherein the machine learning is unsupervised learning.

7. The apparatus according to claim 6, wherein in the unsupervised learning, one of a mean squared error, an average mean squared error, a mean absolute error, and a mean squared logarithmic error is used as a loss function.

8. The apparatus according to claim 4, wherein the machine learning is reinforcement learning.

9. The apparatus according to claim 8, wherein in the reinforcement learning, a reciprocal of one of a mean squared error, an average mean squared error, a mean absolute error, and a mean squared logarithmic error is used as a reward.

10. The apparatus according to claim 1, wherein the apparatus is incorporated in an imprint apparatus configured to bring a mold into contact with an imprint material on a substrate and to cure the imprint material to form a pattern made of a cured product of the imprint material.

11. The apparatus according to claim 10, wherein a force applied to a mold holder configured to hold the mold is controlled as the force to be applied to the object.

12. The apparatus according to claim 1, wherein the information includes information related to a displacement of the object.

13. The apparatus according to claim 1, wherein the member includes a plurality of elements, and the model includes a plurality of three element models respectively corresponding to the plurality of elements.

14. An imprint apparatus that brings a mold into contact with an imprint material on a substrate and cures the imprint material to form a pattern made of a cured product of the imprint material, comprising:
  a mold holder configured to hold the mold;
  a driver configured to apply a force to the mold holder;
  an estimator configured to estimate, based on information related to a state of the mold holder, a disturbance force to be applied to the mold holder via a member connected to the mold holder, using a model that includes a plurality of parameter values indicating one or more characteristics of an attenuation and a stiffness regarding the member; and
  a corrector configured to correct a command value provided to the driver so as to reduce an influence of the disturbance force estimated by the estimator,
  wherein the model includes a three element model comprising a first spring having a first end connected to the object, and a second spring and a damper which are arranged in parallel and serially connected to a second end of the first spring.

15. The apparatus according to claim 14, wherein the member is directly connected or indirectly connected to the mold holder.

16. The apparatus according to claim 14, further comprising:
  a measurement unit configured to measure the information.

17. The apparatus according to claim 14, further comprising:
  an acquirer configured to acquire the disturbance force,
  wherein the determiner determines, based on the disturbance force acquired by the acquirer, the plurality of parameter values through machine learning.

18. The apparatus according to claim 17, wherein in position feedback control in which the driver is operated based on a difference between a position command value for commanding a position of the object and a measured value of the position of the object so that the position command value and the measured value will match, the acquirer acquires the disturbance force based on the difference and the measured value.

19. A method of manufacturing an article, comprising:
  forming a pattern on a substrate by using an imprint apparatus according to claim 14; and
  processing the substrate on which the pattern is formed in the forming.

* * * * *